(12) United States Patent
Masayuki et al.

(10) Patent No.: US 10,545,621 B2
(45) Date of Patent: *Jan. 28, 2020

(54) IDENTIFIER-PROVIDING DEVICE FOR COMPUTER DEVICE

(71) Applicant: GOCCO. CO., LTD., Gifu (JP)

(72) Inventors: Mori Masayuki, Osaka (JP); Kondo Takashi, Gifu (JP); Takagishi Susumu, Nara (JP)

(73) Assignee: Gocco Co., LTD., Gifu (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/162,388

(22) Filed: Oct. 17, 2018

(65) Prior Publication Data

US 2019/0155414 A1     May 23, 2019

Related U.S. Application Data

(63) Continuation of application No. 15/197,839, filed on Jun. 30, 2016, now Pat. No. 10,139,970, which is a continuation of application No. PCT/JP2013/085287, filed on Dec. 30, 2013.

(51) Int. Cl.
*G06F 3/044* (2006.01)
*H05K 1/09* (2006.01)
*H05K 1/02* (2006.01)
*G06F 3/039* (2013.01)
(Continued)

(52) U.S. Cl.
CPC ............ *G06F 3/044* (2013.01); *G06F 3/039* (2013.01); *H05K 1/0266* (2013.01); *H05K 1/0275* (2013.01); *H05K 1/0292* (2013.01); *H05K 1/095* (2013.01); *H05K 1/097* (2013.01); *H05K 3/1233* (2013.01); *G06F 2203/04103* (2013.01); *G06F 2203/04104* (2013.01); *H05K 1/0386* (2013.01); *H05K 2201/0245* (2013.01);
(Continued)

(58) Field of Classification Search
USPC ........................................ 345/174
See application file for complete search history.

(56) References Cited

U.S. PATENT DOCUMENTS

2006/0042076 A1* 3/2006 Previti ................ H05B 3/146
29/825
2009/0161299 A1* 6/2009 Nemoto ............ H01G 9/0425
361/532
(Continued)

*Primary Examiner* — Chineyere D Wills-Burns
(74) *Attorney, Agent, or Firm* — Muskin and Farmer LLC

(57) ABSTRACT

A mass produced electrically conductive device with sufficiently high yield, even when forming a conductive layer pattern having an extremely small thickness/minimum area using a minimum amount of silver paste. The identifier-providing device has a conductive layer pattern formed on a rear surface of a base material as an insulator. The silver paste forming the conductive layer pattern contains only silver flakes, as silver particles, that have a particle size in a range of 3.0 to 5.0 μm and that has a thickness of 100 nm at a largest thickness portion, while having a thickness of 50 nm at a smallest thickness portion. The conductive layer pattern is formed to have a film thickness of 10 μm or less by laminating the silver flakes in the thickness direction. The silver flakes forming the conductive layer are in a fused state or an aggregating/cohering state at the smallest thickness portion.

8 Claims, 20 Drawing Sheets

(51) Int. Cl.
*H05K 1/03* (2006.01)
*H05K 3/12* (2006.01)

(52) U.S. Cl.
CPC ........... *H05K 2201/0326* (2013.01); *H05K 2203/0139* (2013.01); *H05K 2203/1131* (2013.01)

(56) References Cited

U.S. PATENT DOCUMENTS

| | | | | |
|---|---|---|---|---|
| 2010/0330350 | A1* | 12/2010 | Osada | B32B 27/36 428/213 |
| 2011/0260115 | A1* | 10/2011 | Kim | B82Y 10/00 252/503 |
| 2012/0068962 | A1* | 3/2012 | Yamamoto | G06F 1/1656 345/174 |
| 2012/0171499 | A1* | 7/2012 | Rouse | B22F 1/004 428/457 |
| 2014/0306167 | A1* | 10/2014 | Terao | H01B 1/02 252/514 |
| 2016/0114390 | A1* | 4/2016 | Hori | B22F 9/24 252/512 |
| 2016/0347930 | A1* | 12/2016 | Okafuji | B32B 27/365 |

* cited by examiner

FIG. 2
(a)
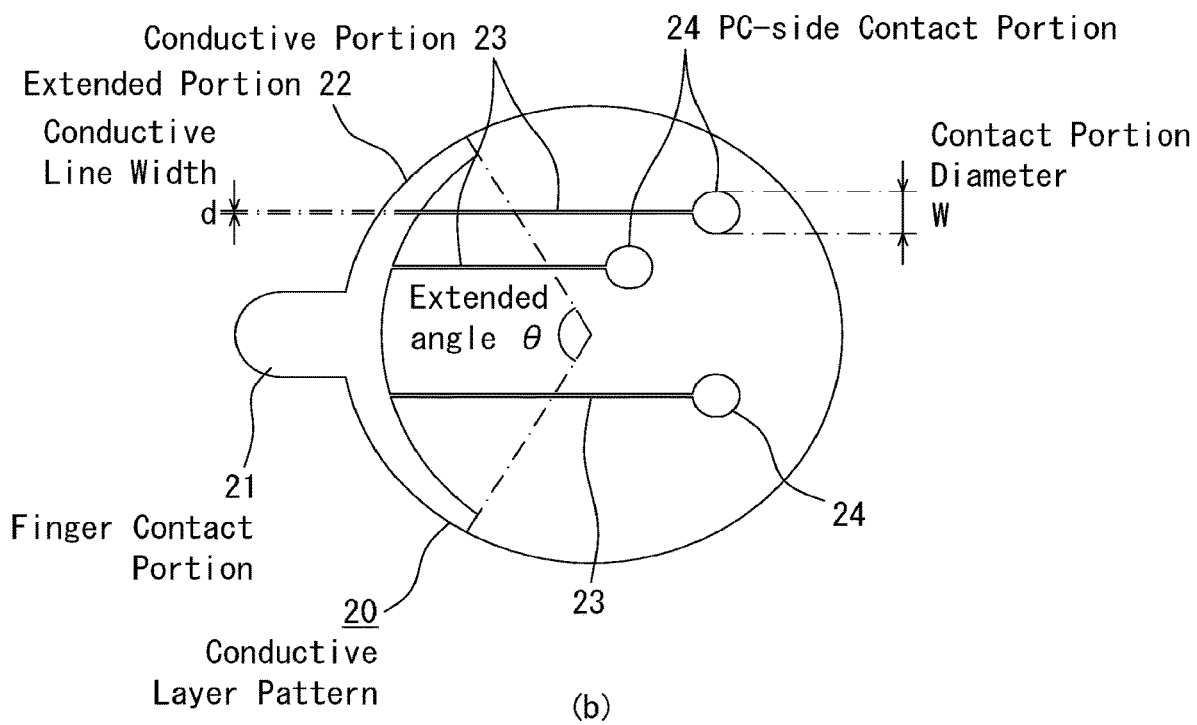
(b)
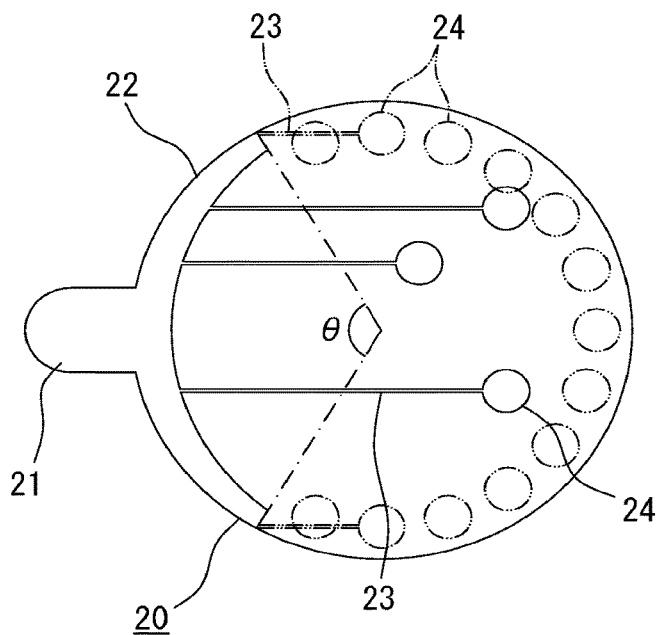

FIG. 3
(a)
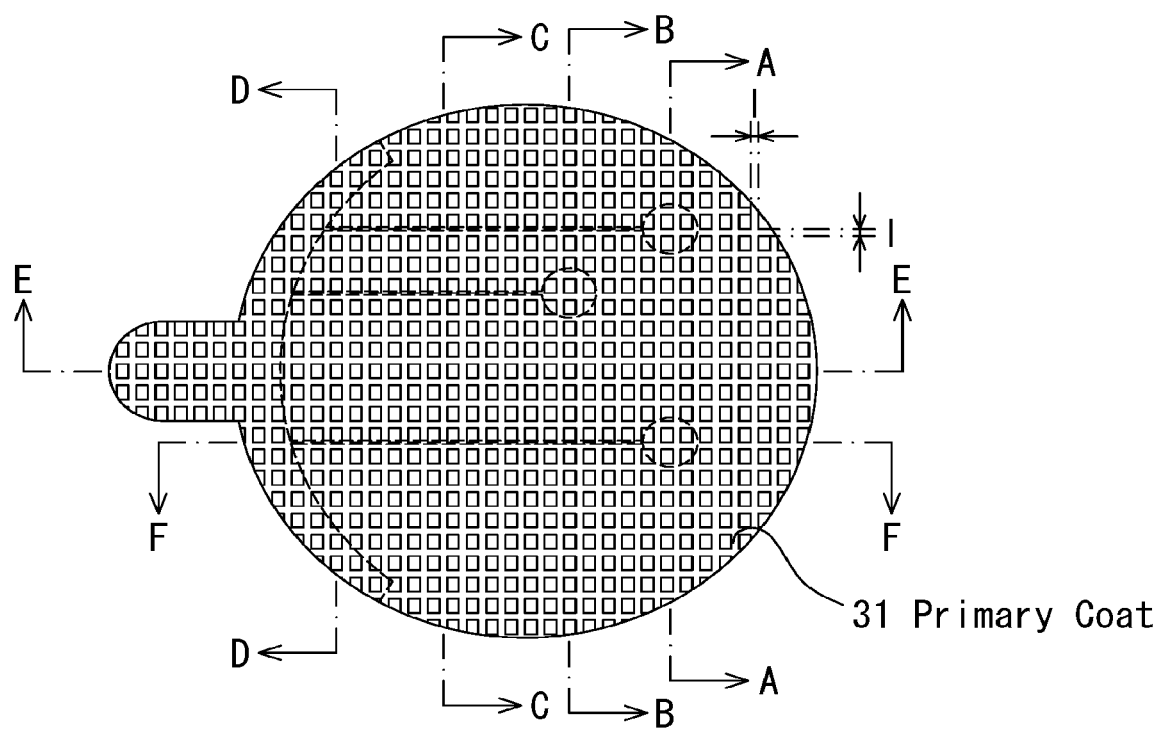
31 Primary Coat
(b)
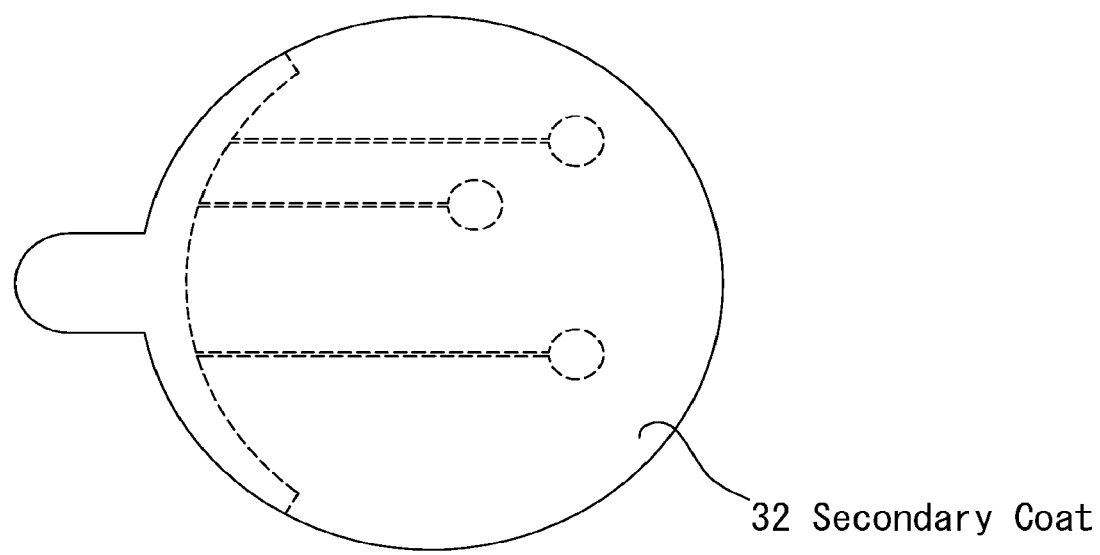
32 Secondary Coat

FIG. 4
(a) 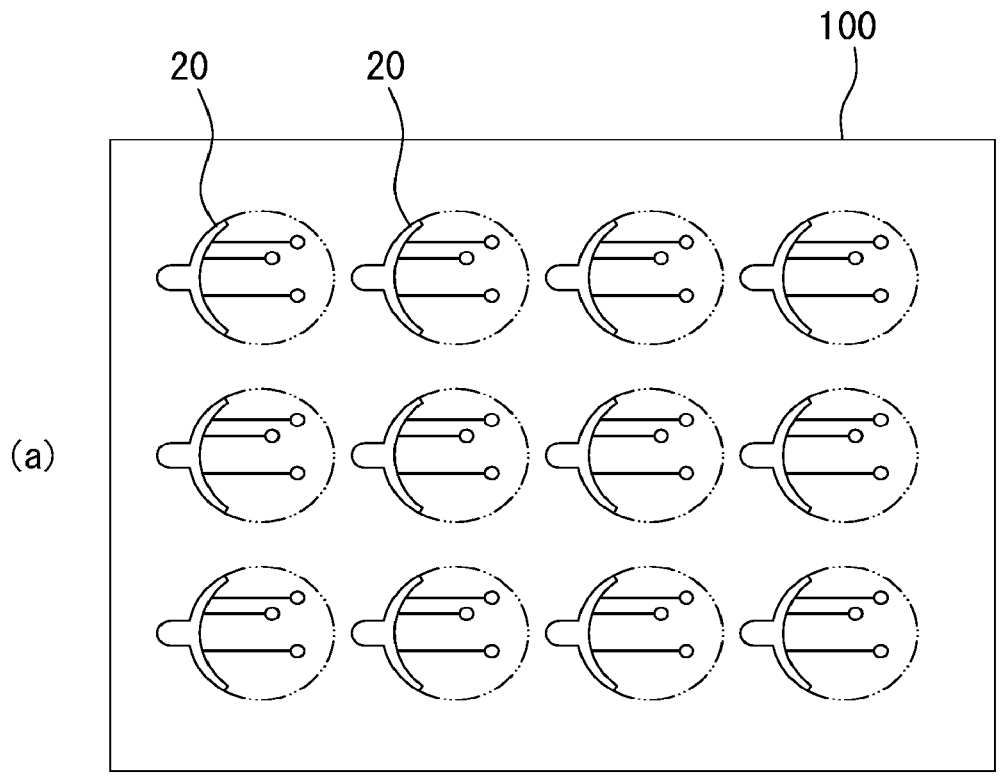
(b) 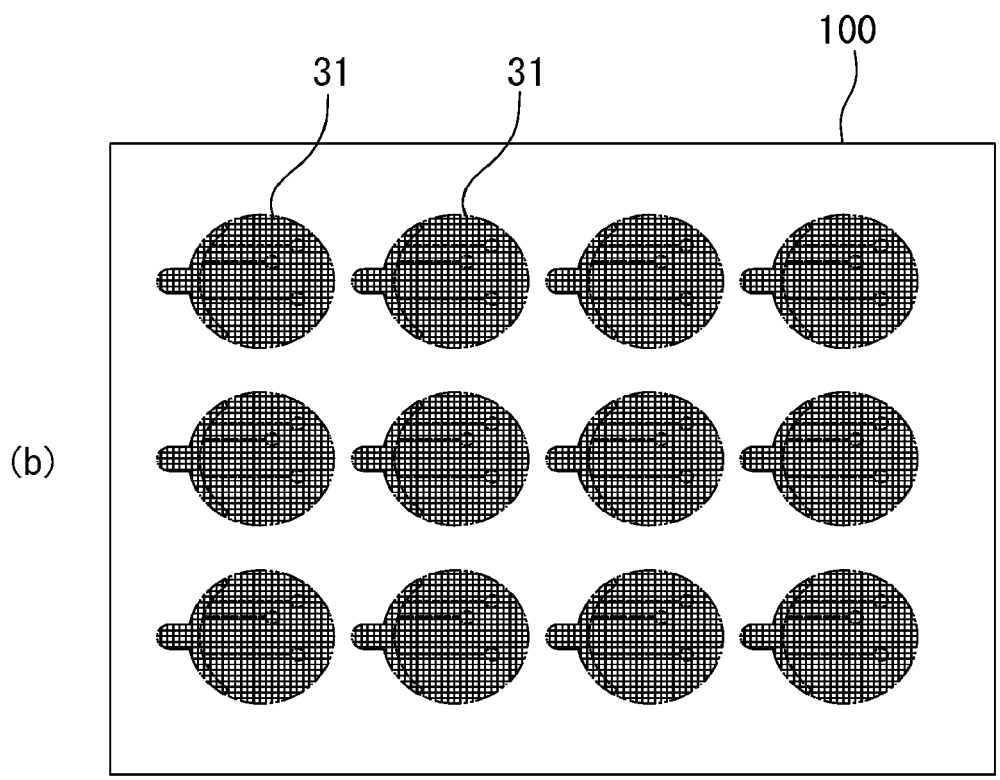

FIG. 13
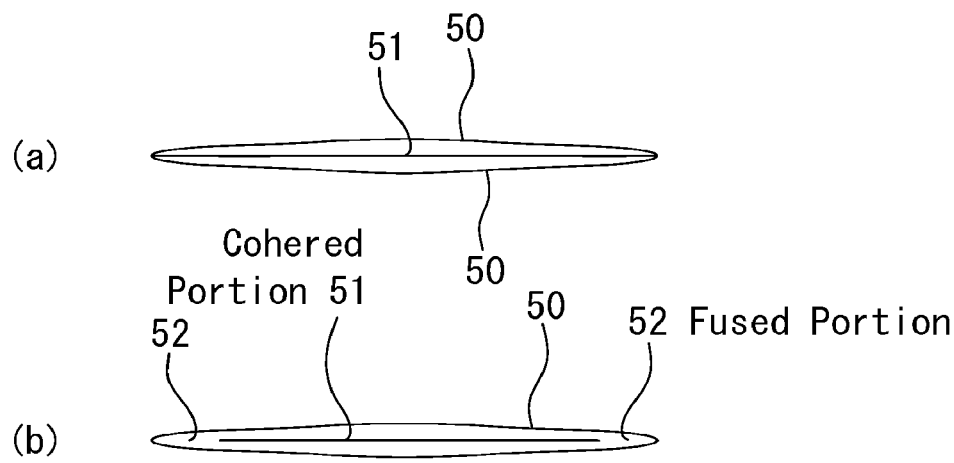
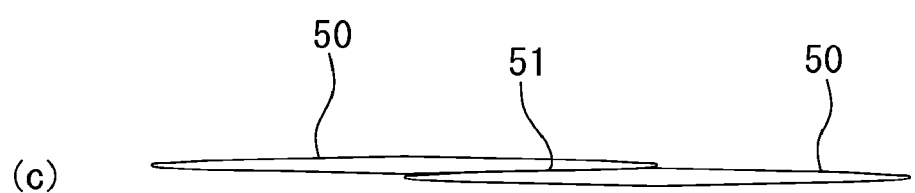
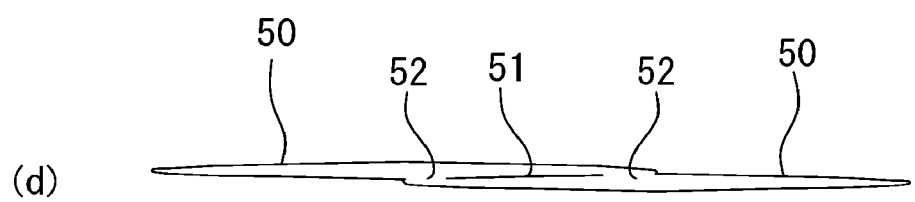
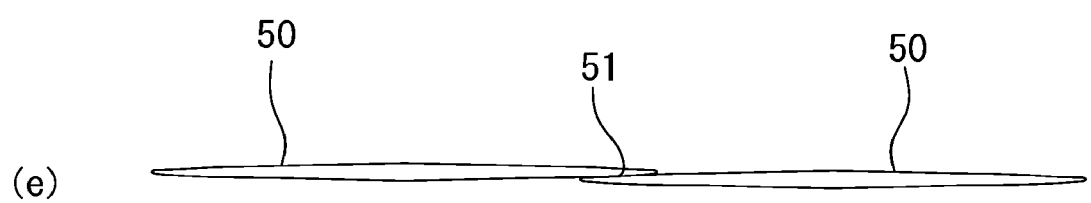
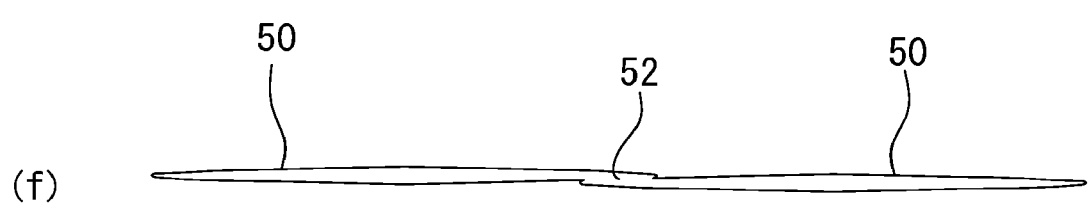

IDENTIFIER-PROVIDING DEVICE FOR COMPUTER DEVICE

CROSS REFERENCE TO RELATED APPLICATIONS

This application claims the benefit of PCT/JP2013/085287, which is incorporated by reference herein in its entirety, and the benefit of U.S. patent application Ser. No. 15/197,839 which is incorporated by reference herein in its entirety.

TECHNICAL FIELD

The present invention relates to an electrically conductive device having a base material as an insulator and a conductive layer pattern formed on the base material.

BACKGROUND ART

As an example of a computer device to which the identifier providing device of the present invention is applicable, typically, there is a computer device such as a tablet or a smartphone or the like (which may be referred to as a "touch-type computer device" hereinafter) provided with a capacitive touch screen or a capacitive touch pad (which may be referred to as a "capacitive touch device" hereinafter). The touch-type computer device is configured so that, for example, if a user touches (multi-touches) a touch screen with a predetermined number of fingers, it starts executing a predetermined information processing. In this case, the touch-type computer device gets the number of the touch points and coordinates of each touch point of the multi-touch of the user and executes a preset information processing operation depending on the number of the touch points and the coordinates of each touch point of the multi-touch.

On the other hand, the present inventors have devised an invention of a drive device for making the touch-type computer device execute the aforementioned information processing operation by the multi-touch without touching the touch screen directly with the finger. Moreover, the present inventors have completed an invention of a drive device that enables cost reduction and mass production as a result of continued research and development. The invention of this drive device has been filed as the following patent application (Japanese Patent Application No. 2010-208419).

The invention of this patent application relates to an information processing system using a multi-touch function, in which a separate and independent (separate body of) drive device is paired with an information processing device having a multi-touch display of capacitive and in which the drive device is brought into contact with the multi-touch display of the information processing device to make the information processing device execute a desired data processing. Particularly, it relates to a drive device for the information processing device, and to an information processing system including the information processing device and the drive device. It is an object of the invention to enables easy and reliable multi-touch on a multi-touch display, and to enable a plurality of fingers to be touched simultaneous and correctly at a predetermined plurality of contact positions even in the case of a small multi-touch display. Then, the invention adopts a configuration, as solving means to achieve the object, in which, when an information processing device is pressed to an opposed surface of a drive device, a contact portion of a predetermined arrangement mode is in contact with a contact area of a corresponding arrangement mode on a multi-touch display (a button-like area that is set on a screen) such that the information processing device executes a corresponding process (content displaying processing, etc.) and such that a charge storage part allows a charge transfer from the contact portion at the contact area through a conductive portion so as to ensure occurrence of a change in capacitance at the contact area.

PRIOR ART LITERATURE

Patent Literature

Patent Document 1: JP-A-2011-134298 Publication

SUMMARY OF THE INVENTION

Technical Problem Solved by the Invention

The invention of this drive device may also be applied to an identifier providing device that provides a unique identifier as a command for executing a predetermined information processing for an information processing device comprising a computer device. Meanwhile, in the drive device concretely embodying this invention, in order to provide a unique identifier as a command for executing a predetermined information processing, it is necessary to form a predetermined conductive layer pattern (a pattern made of a conductive layer formed by arranging separately the contact portions in a predetermined arrangement manner). However, in the course of a keen research and development, the present inventors have confirmed that it is necessary to apply a considerable large amount of silver paste on a base in order to cause a predetermined capacitance change at the contact area of the multi-touch display through the conductive layer pattern. Further, the present inventors have confirmed through experiments or the like that a thickness of the conductive layer pattern itself becomes relatively large by the large amount of the silver paste on the base and that an area of the conductive layer pattern is also required to a considerable extent. However, the silver paste as a raw material of the conductive layer pattern is very expensive. Thus, in the invention of the drive device, it is expected that the manufacturing cost is greatly increased even if at a mass production is aimed. In the case of forming the conductive layer pattern by coating a predetermined pattern of the silver paste on the base, it is preferable to use a screen printing or the like from the viewpoint of mass production or the like. However, the present inventors have confirmed that, in case a large amount of the silver paste is coated on the base as described above, uneven quality occurs after production and a yield is lowered to a considerable degree.

Accordingly, it is an object of the present invention to provide an electrically conductive device that is able to achieve a required conductivity (specific resistance) to greatly reduce the manufacturing cost by forming a conductive layer pattern with a minimum necessary area and with only a very small thickness by using a minimum required amount of a silver paste on a surface of a base made of an insulator, and in that, even if the conductive layer pattern with the minimal thickness/minimum required area by using the minimum necessary amount of the silver paste, sufficiently good yield production is achieved to attain mass-production.

Solution to Problem

An electrically conductive device according to the present invention has a base material as an insulator (typically a predetermined form of a solid made of an insulating material), and a conductive layer pattern formed by coating a silver paste on a predetermined surface of the base material (typically, with a predetermined range and/or a predetermined area) so as to be a predetermined pattern by printing. The silver paste for forming the conductive layer pattern contains, as silver particles, only silver flake having a particle size "d" in a range of 3.0-5.0 µm (preferably, 3.5-4.5 µm) and a thickness T11 at a maximum thickness portion is in a range of 100 nm or less (preferably, 50 nm or less) and a thickness T13 at an extremely small thickness portion is in a range of 50 nm or less (e.g., 30-50 nm, preferably, 20-30 nm). The conductive layer pattern is formed by laminating the silver flakes in a thickness direction (typically, substantially in parallel) such that a film thickness T2 is in a range of 10 µm or less (preferably, 5-6 µm). The silver flakes forming the conductive layer is in a fused state or in an aggregated/cohering state with each other at the extremely small thickness portion.

Advantageous Effects of Invention

The present invention attains an electrically conductive device that is able to achieve a required conductivity (specific resistance) to greatly reduce the manufacturing cost by forming a conductive layer pattern with a minimum necessary area and with only a very small thickness by using a minimum required amount of a silver paste on a surface of a base made of an insulator, and in that, even if the conductive layer pattern with the minimal thickness/minimum required area by using the minimum necessary amount of the silver paste, sufficiently good yield production is achieved to attain mass-production.

BRIEF DESCRIPTION OF THE DRAWINGS

FIG. 2 is a bottom view showing a surface at a side of a conductive layer pattern of the identifier providing device for the computer device according to the first embodiment of the present invention.

FIG. 3 is a bottom view showing the surface at the side of the conductive layer pattern of the identifier providing device for the computer device according to the first embodiment of the invention, wherein (a) shows a state in which a primary coat is formed, and (b) shows a state in which a secondary coat is formed.

FIG. 4 is a process drawing showing steps of forming the identifier providing device for the computer device according to the first embodiment of the present invention, wherein (a) shows a conductive pattern forming step, and (b) shows a primary coat forming step.

FIG. 13 is an explanatory drawing showing a partial fused structure of selected silver flakes in a stacked state in the conductive layer pattern of the identifier providing device for the computer device according to the first embodiment of the present invention.

DESCRIPTION OF EMBODIMENTS

Several modes for embodying of the invention ("embodiments" hereafter) are described hereunder. The same symbol is attached to the same member, element or portion throughout each of the embodiments to skip the explanation.

[Overall Configuration of Identifier Providing Device]

Figure 1:
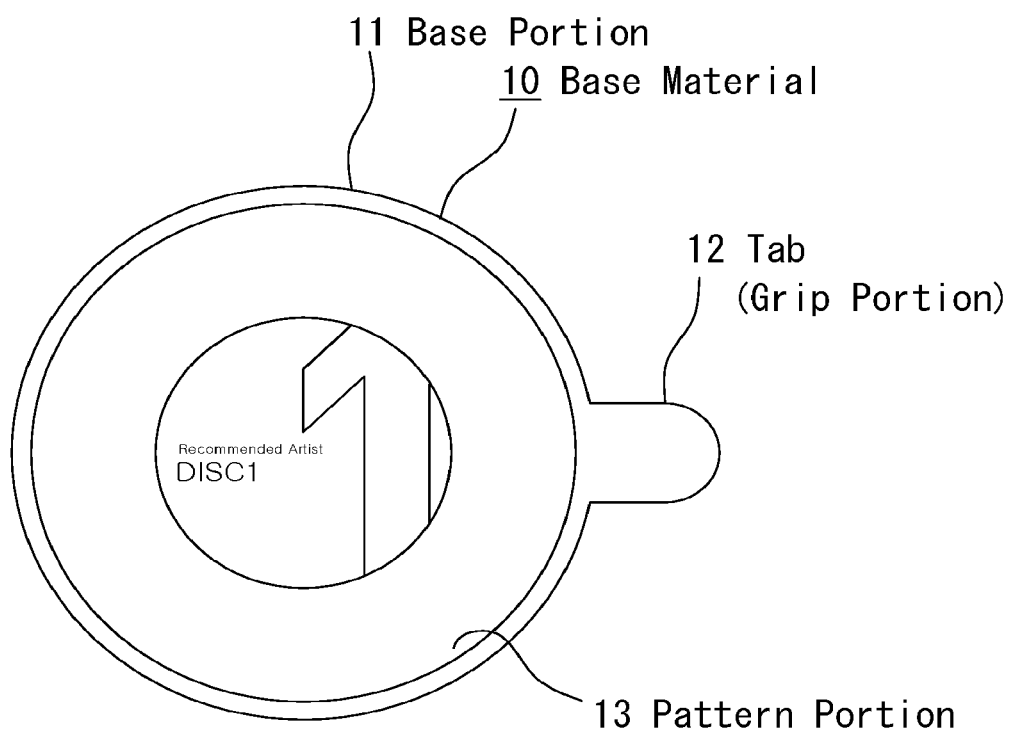
FIG. 1 is a plan view showing an identifier providing device for a computer device according to a first embodiment of the present invention.

The present invention may be embodied as an identifier providing device of an embodiment (First Embodiment) shown in FIGS. 1 to 11. Hereinafter, the identifier providing device is described with reference to FIGS. 1 to 11. As shown in FIG. 1, the identifier providing device of the present embodiment has a base material 10 which is integrally formed into a predetermined shape, and, as shown in FIG. 2, a conductive layer pattern 20 which is integrally formed at a predetermined range of a surface of the base material 10. Below, the configuration of each part of the identifier providing device is described in detail.

[Configuration of Each Part of Identifier Providing Device]

<Base Material>

In detail, as shown in the following drawing (FIG. 1), the base material 10 is made by integrally forming a tab 12 as a predetermined shape of a grip portion on a predetermined shape of a base portion 11. More specifically, the base portion 11 has a sheet form of a precise circle shape. Further, the tab 12 has a sheet shape of a half-track shape obtained by cutting in half a sheet material of an oval shape or a track shape in a length direction. The tab 12 has its base end joined to an outer peripheral edge of the base portion 11 so as to be integrally continuous at a predetermined angular position thereof, thereby extending outwardly in a same plane as the base portion 11 (to become flush) (to be exact, outwardly in a radial direction of the base portion 11). The base material 10 is formed integrally so as to be sheet-shaped (shown in FIG. 1) made of the base portion 11 and the tab 12 with a sheet of paper material having a predetermined paper quality.

The base material 10 may be formed from any insulator (a predetermined shape of a solid consisting of a non-conductive material or an insulating material), for example, from a paper stock, a wood material, an electrical insulation material such as a synthetic resin (dielectric material), and, in some cases, it may be formed from an inorganic material such as a stone material as long as it is an insulator. However, the base material 10 is typically formed into a thin sheet shape from a paper sheet consisting of the paper stock, a synthetic resin sheet made of the synthetic resin material (into a sheet shape with a thickness equal to an ordinary paper sheet). Note that, although a predetermined pattern 13 is provided by printing or the like on the surface of the base portion 11 of the base material 10, as shown in FIG. 1, it is also possible not to provide the pattern 13.

<Conductive Layer Pattern>

As shown in FIG. 2 (*a*), a conductive layer pattern 20 is a conductive layer having a predetermined pattern shape composed of a finger contact portion 21 as a human-body-side grounding portion, an extended portion 22 as a general-purpose conductor portion, a conductive portion 23 as an individual conductor portion, and a PC-side contact portion 24 as a PC-side drive portion. The conductive layer pattern 20 is formed by coating a slurry-like silver paste ink on a surface of the base portion 11 of the base material 10 (typically, by a printing technique such as a screen printing) so as to have a predetermined pattern, while the ink containing silver flakes having a minimum thickness and a uniform particle size (hereinafter sometimes referred to as "selected silver flake"), which are obtained by preparing and/or selecting silver particles having a predetermined scaly shape, a flaky shape or a flake shape (hereinafter referred to as "silver flake"). In particular, the finger contact portion 21 is coated and stacked and formed integrally by printing on an entire rear surface of the tab 12 of the base material 10 so as to form a coating film shape corresponding to the tab 12. The extended portion 22 is coated and stacked and formed integrally by printing on a rear surface of the base portion 11 of the base material 10 so as to extend in a predetermined angular range at opposite sides in a circumferential direction (direction away from each other) about the tab 12, thereby having an arch-like coating film shape with a predetermined extension angle θ. The conductive portion 23 is coated and stacked and formed integrally by printing on the rear surface of the base portion 11 of the base material 10 so as to extend from an inner peripheral edge of the extended portion 22 in a linear fashion into a direction parallel to the diametrical direction of the base portion 11 (hereinafter sometimes referred to as "diametrical parallel direction") (and to extend in a direction parallel to a longitudinal axis of the tub 11), thereby having a straight thin line shape of a coating film shape with a predetermined width "d" (hereinafter sometimes referred to as "conductor width d"). The PC-side contact portion 24 is coated and stacked and formed integrally by printing at a leading end of the conductive portion 23 on the rear surface of the base portion 11 of the base material 10 so as to have a precise circle shape of a paint film shape with a predetermined diameter W (hereinafter sometimes referred to as "contact portion diameter W").

As described above, in the identifier providing device of the present embodiment, the base material 10 includes the base portion 11 as a main portion, and the grip portion 12 as an attached portion that is formed continuously to one end of the base portion 11. The base portion 11 has a first dimension (a vertical dimension from an upper end to a lower end in FIG. 2, i.e., a diameter in a vertical direction) in a first direction (vertical direction in FIG. 2) and a second dimension (excluding (gripper 12 in FIG. 2) lateral dimension from a left end to a right end (except the grip portion 12) in FIG. 2, i.e., a diameter in a lateral direction) in a second direction (horizontal direction in FIG. 2) that is to perpendicular to the first direction. Further, the finger contact portion 21 of the conductive layer pattern 20 is formed on the rear surface of the grip portion 12 to have a planar shape with a predetermined area as a first conductive layer portion that is conductive to a finger of a user when the user holds the grip portion 12 of the base member 10 with the fingers. Moreover, the extended portion 22 is extended so as to intersect with the first direction on the rear surface of the base portion 11 and has a predetermined planar shape with a predetermined area as a second conductive layer portion that is formed by being electrically connected to the finger contact portion 21. Furthermore, as the conductive portion 23, a predetermined plurality number (three in the illustrated example) are provided, and the respective one has a conductive wire shape as a third conductive layer portion formed on and electrically connected to the extended portion 22 so as to extend linearly in the first direction of the base portion 11 from the extended portion 22 on the rear surface of the base portion 11. In addition, as the PC-side contact portion 24, a same plurality number as the conductive portions 23 (three in the illustrated example) are provided, and the respective one has a planar shape with a predetermined area as a fourth conductive layer portion that is electrically connected to a leading end of the conductive portion 23 on the rear surface of the base portion 11. Then, in a state where the fingers of the user hold the grip portion 12 of the base material 10, when the base portion 11 of the base material 10 has the surface at the side of the conductive layer pattern 20 (rear surface) abutted against a touch screen of the touch-type computer device, the PC-side contact portions 24 of the conductive layer pattern 20 become conductive to the finger of a user through the conductive portions 23, the extended portion 22, and the finger contact portion 21, thereby causing a capacitance change on the touch screen. Furthermore, the extended portion 22 of the conductive layer pattern 20 is extended at a predetermined extension angle such that, when two PC-side contact portions 24 among the plurality of PC-side contact portions 24 (the upper and lower PC-side contact portions 24 in the example of FIG. 2) are placed on opposite end portions of the base portion 11 in the second direction, the extended portion 22 extends over base end positions of two conductive portions 23, which have the above two PC-side contact portions 24 formed at the leading ends thereof, among the conductive section 23 (upper and lower conductive portions 23 in FIG. 2).

[Extension Angle θ of Extended Portion 22 (One of Characteristics of the Present Invention)]

Here, as shown in FIG. 2 (a), the extended portion 22 is provided on the base portion 11 such that, in a range of a semicircular portion (i.e., at the side of the tab 12) of the base portion 11 having the precise circular shape, the extension angle θ becomes a predetermined angle within an angular range of the outer peripheral edge of the semicircular portion (i.e., within an angular range of 180 degrees at the side of the tub 12). The extension angle θ of the extended portion 22 is set such that, in case of the straight conductive portions 23 extending in the diametrical parallel direction (parallel to the diametrical direction of the base portion 11) from the circumferential ends of the extended portion 22, an arrangement position of the PC-side contact portion 24 with a predetermined diameter W, which is connected to the tip, is set to cover an entire range of the rear surface of the base portion 11.

More specifically, as shown in FIG. 2 (b), suppose a diametrical direction (horizontal direction in FIG. 2, hereinafter sometimes referred to as "horizontal diametrical direction") passing a widthwise center of the tab 12 on the base portion 11, and a diametrical direction (vertical direction in FIG. 2, hereinafter sometimes referred to as "vertical diametrical direction") perpendicular to the horizontal diametrical direction. In this case, when the PC-side contact portions 24 are disposed on both upper and lower ends on a virtual line in the vertical diametrical direction of the base portion 11, while the leading ends of the conductive portions 23 are connected to the PC-side contacting portions 24, and the conductive portions 23 are extended linearly in the diametrical parallel direction toward the extended portion 22, if the opposite circumferential ends of the extended portion 22 are located at positions where the base ends of the conductive portions 23 intersect with the outer peripheral edge of the base portion 11, as shown the following drawing (FIG. 2 (b)), even if the PC-side contact portions 24 are placed at any positions of the base portion 11, the base ends of the conductive portions 23 extending linearly from the PC-side contact portions 24 in the diametrical parallel direction can be connected to the extended portion 22.

In other words, if the PC-side contact portions 24 are placed at the upper end and the lower end on the virtual line in the vertical diametrical direction of the base portion 11, and if the extended portion 22 is extended to the angular positions where the terminal ends of the straight lines extending in the horizontal diametrical direction toward the extended portion 22 from the centers of the contact portion diameters W intersect with the outer peripheral edge of the base portion 11, respectively, the PC-side contact portion 24 with the predetermined diameter W may be placed at a desired position on the base portion 11 so as to cover the entire range of the rear surface of the base portion 11. Then, the set value of the extension angle θ is dependent also on the contact portion diameter W of the PC-side contact portion 24 (and, although somewhat depends on the conductor width "d" of the conductive portion 23), for example, in the case where the contact portion diameter W is set in the range of 7 mm-10 mm, if the range of the extension angle θ of the extended portion 22 is set in the range of 115 degrees to 125 degrees, the PC-side contact portion 24 with the predetermined diameter W can be arranged at a desired position of the base portion 11 so as to cover the entire range of the rear surface of the base portion 11. Preferably, when the contact portion diameter W is set at 7 mm, the extension angle θ of the extended portion 22 is set to be in the angular range of 120 degrees.

Thus, if the extended portion 22 of the conductive layer pattern 20 is provided with the extension angle θ as described above, even in case of changing the arrangement positions and/or arrangement number of the PC-side finger contact portions 24 for a predetermined information processing operation using a touch screen or a touch pad of a touch-type computer device, it is enough for the extended portion 22 to have exactly the same configuration (i.e., the same position, the same coating film planar shape, and the same area), and it is only necessary to change just the configurations of the conduction parts 23 and the PC-side contact portions 24 as desired (i.e., depending on the desired positions of the PC-side contact portions 24). Therefore, in the case of printing the conductive layer pattern 20 on the rear surface of the base material 10 by printing, it is possible for the configuration of a printing apparatus side (typically, a configuration of a mask and mask openings in the case of a screen printing) to address any change of the arrangement of all the PC-side contact portions 24, since the finger contact portion 21 and the extended portion 22 are made into the same configurations. Thus, it is possible to reduce the manufacturing cost for the mask or the like, while improving the workability at the time of manufacturing with respect to the mask work, thereby to contribute to the improvement of the overall manufacturing cost and the workability.

[Shielding Layer (One of the Features of the Present Invention)]

<Primary Coat>

As shown in the following drawing (FIG. 3), the entire rear surface (entire rear surface of the base portion 11 and the tab 12) of the base material 10 of the identifier providing device is completely shielded with a primary coat 31 and a secondary coat 32 as shielding layers. Thus, even the whole of the conductive layer pattern 20 formed on the rear surface of the base material 10 is completely shielded by the primary coat and the secondary coat as the shielding layers. In detail, as shown in FIG. 3 (a), the primary coat 31 is integrally coated and stacked and formed over the entire range of the rear surface of the base material 10, as a primer layer, by printing on the base material 10 and the conductive layer pattern 20 so as to cover the entirety of the rear surface portion of the base material 10 (to be precise, unexposed portion that is not covered with the conductive layer pattern 20) and the conductive layer pattern 20 on the base material 10. Thus, the primary coat 31 forms a lower shielding layer having a same outline as an outline of the base material 10. The primary coat 31 is a lattice-like or matrix-like coating film and is made by densely arranging a number of rectangular openings at regular intervals in the vertical direction and horizontal direction of the base material 10. That is, the rear surface of the base material 10 and a part of the conductive layer pattern 20 are exposed from the openings of the primary coat 31. Incidentally, the primary coat 31 is formed into the lattice-like coating film by a printing ink of a blue color (ultramarine blue, blue, etc.).

<Secondary Coat>

On the other hand, as shown in FIG. 3 (b), the secondary coat 32 is coated and stacked and formed integrally by printing on the primary coat 31, as an overcoat layer or an exposed layer, so as to cover the entirety of the rear surface portion of the base material 10 and the conductive layer pattern 20 on the base material 10, further from a top of the primary coat 31, over the entire range of the rear surface of the base material 10. The secondary coat 32 constitutes an upper shielding layer having an outline as the outline of the base material 10. The secondary coat 32 is a coating film having a fully sealed sheet shape or film shape (without gaps and openings). That is, the rear surface or any part of the conductive layer pattern 20 is not exposed from the secondary coat 32 (via the grid-like primary coat 31). The secondary coat 32 completely shields the whole of the rear surface of the base material 10 from an outside, including the conductive layer pattern 20. Incidentally, the secondary coat 32 is also formed on the above-mentioned coating film shape (or solid paint film shape without holes) by the printing ink of the similar blue color to (preferably identical with) the primary coat 31.

<Effect of Blue-Based Primary Coat 31 (Lattice Coating Film Shape) and Secondary Coat 32 (Coating Film Shape)>

In the above examples, the primary coat 31 and the secondary coat 32 are formed by the blue-based printing ink to completely shield the silver-based color of the conductive layer pattern 20 on the base material 10 from the outside, thereby preventing an inside of the conductive layer pattern 20 from being visible easily from the outside. Here, in the case of forming the primary coat 31 and the secondary coat 32 by the blue-based printing ink, if the primary coat 31 is formed into the above-described lattice-like coating film shape, and if the secondary coat 32 is formed into the coating film shape, it is possible to increase an efficiency to prevent the visibility from the outside of the silver-based color of the conductive layer pattern 20 on the base material 10 (hereinafter may be referred to as "visual shielding efficiency") especially by an optical effect by a large number of grids (and a large number of openings) of the primary coat 31 (against an external light entering the shielding layer).

Modified Example of Shielding Layer (One of Characteristics of the Present Invention)

<Primary Coat>

On the other hand, the identifier providing device may use a white-based and/or gray-based printing inks as a shielding layer for shielding the conductive layer patterns 20 on the base material 10 from the outside. In this case, as in the primary coat 31, a primary coat as a primer layer in the modified example of the shielding layer is coated and stacked and formed integrally by printing on the base material 10 and the conductive layer pattern 20 so as to cover the entire range of the rear surface of the base material 10. Thus, the primary coat constitutes a lower shielding layer having a same outline as the outline of the base material 10. On the other hand, the primary coat is formed into a coating film having a completely shielded sheet shape or film shape (without gaps or openings) by the gray-based (ash-colored) printing ink, in the same manner as the secondary coat 32. That is, in this case, the rear surface and any part of the conductive layer pattern 20 of the base material 10 are not exposed even from the primary coat as the primer layer. The primary coat completely shields the entire rear surface of the base material 10 from the outside, including the conductive layer pattern 20.

<Secondary Coat>

Further, in the same manner as the secondary coat 32, the secondary coat as the top coat layer in the modified example of the shielding layer is coated and stacked and formed integrally by printing on the primary coat, so as to cover the entirety of the rear surface portion of the base material 10 and the conductive layer pattern 20 further from the top of the primary coat of the gray color, over the entire range of the rear surface of the base material 10. Thus, the secondary coat 32 constitutes an upper shielding layer having a same outline as the outline of the base material 10. On the other hand, the secondary coat is formed into a coating film shape by the printing ink of white color, in the same manner as the secondary coat 32. That is, the rear surface of the base material 10 and any part of the conductive layer pattern 20 are not exposed even from the secondary coat. The secondary coat completely shields, further from the top of the primary coat, the whole of the rear surface of the base material 10 from the outside, including the conductive layer pattern 20.

<Effect by Gray-Based Primary Coat (Coating Film Shape and White-Based Secondary Coat (Coating Film Shape)>

In the above example, the primary coat 31 and the secondary coat 32 are formed by the gray-based and white-based printing inks, respectively, so as to completely shield the silver-based conductive layer pattern 20 on the base material 10 from the outside, thereby preventing the conductive layer pattern 20 at the inside from being easily visible from the outside. Here, in the case of forming the primary coat 31 and the secondary coat 32 by the white-based and/or gray-based printing inks, if the primary coat 31 is made into the above-mentioned coating film shape of the gray color, and if secondary coat is made into the coating film shape of the white color, it is possible to increase an efficiency to prevent the visibility from the outside of the silver-based color of the conductive layer pattern 20 on the base material 10 (hereinafter may be referred to as "visual shielding efficiency") especially by an synergetic effect of an optical effect by the primary coat having the similar color to the conductive layer paste 20 (against an external light entering the shielding layer) and an optical effect by the secondary coat of the white color increasing a brightness of the gray of the primary coat.

[Method of Manufacturing Identifier Providing Device]

<Printing of Rear Surface of Conductive Layer Pattern 20>

Typically, the identifier providing device of the present embodiment can be mass-produced by using a paper stock for a raw material of the base material 10, a silver paste ink as a conductive ink for the raw material of the conductive pattern 20, while the pattern 13 using a conventional printing ink as raw materials for the shielding layers 31 and 32, by use of a screen printing technique.

Specifically, first, as shown in FIG. 4 (a), in a base paper setting step, a base paper 100 made of a paper material constituting the base material is set on a screen printing machine (not shown). Then, in a conductive pattern forming step, the conductive pattern 20 is printed and formed with a silver paste ink on one side of the base paper (i.e., a surface to be a rear surface of the identifier providing device). In the conductive pattern forming step, a predetermined plurality of conductive patterns 20 is formed on the base paper 100 such that they form a plurality of lines in a width direction of the base paper 100 (vertical direction in FIG. 4 (a)) and a plurality of lines in a longitudinal direction of the base paper 100 (vertical direction in FIG. 4 (a)). Incidentally, in FIG. 4 (a), a two-dot chain line is an imaginary line showing a boundary line (hereinafter may be referred to as "base portion outer periphery") to be the outer peripheral edge of the identifier providing device (outer peripheral edge of the base portion 11) (after a cutout step as a final step). An outline of the single identifier providing device (i.e., a contour of the base material 10, hereafter may be referred to as "base material outline") is constituted by an outline that combines the outer peripheral edge of the finger contact portion 21 of the conductive layer pattern 20, the outer peripheral edge of the extended portion 22, and an outer peripheral edge of a part at which the conductive layer pattern is not formed on the base portion 11 (i.e., an outer peripheral edge of a portion other than the outer peripheral edge of the finger contact portion 21 and the outer peripheral edge of the extended portion 22).

<Printing of Primary Coat 31 on Rear Surface>

Next, as shown in FIG. 4 (*b*), in a primary coat forming step, the primary coat 31 is printed and formed with a predetermined blue-based printing ink by a screen printing machine, so as to cover an entire inner area of a base material outline, from the top of each conductive layer pattern 20 on the base paper 100.

<Printing of Secondary Coat 32 on Rear Surface>

Figure 5:
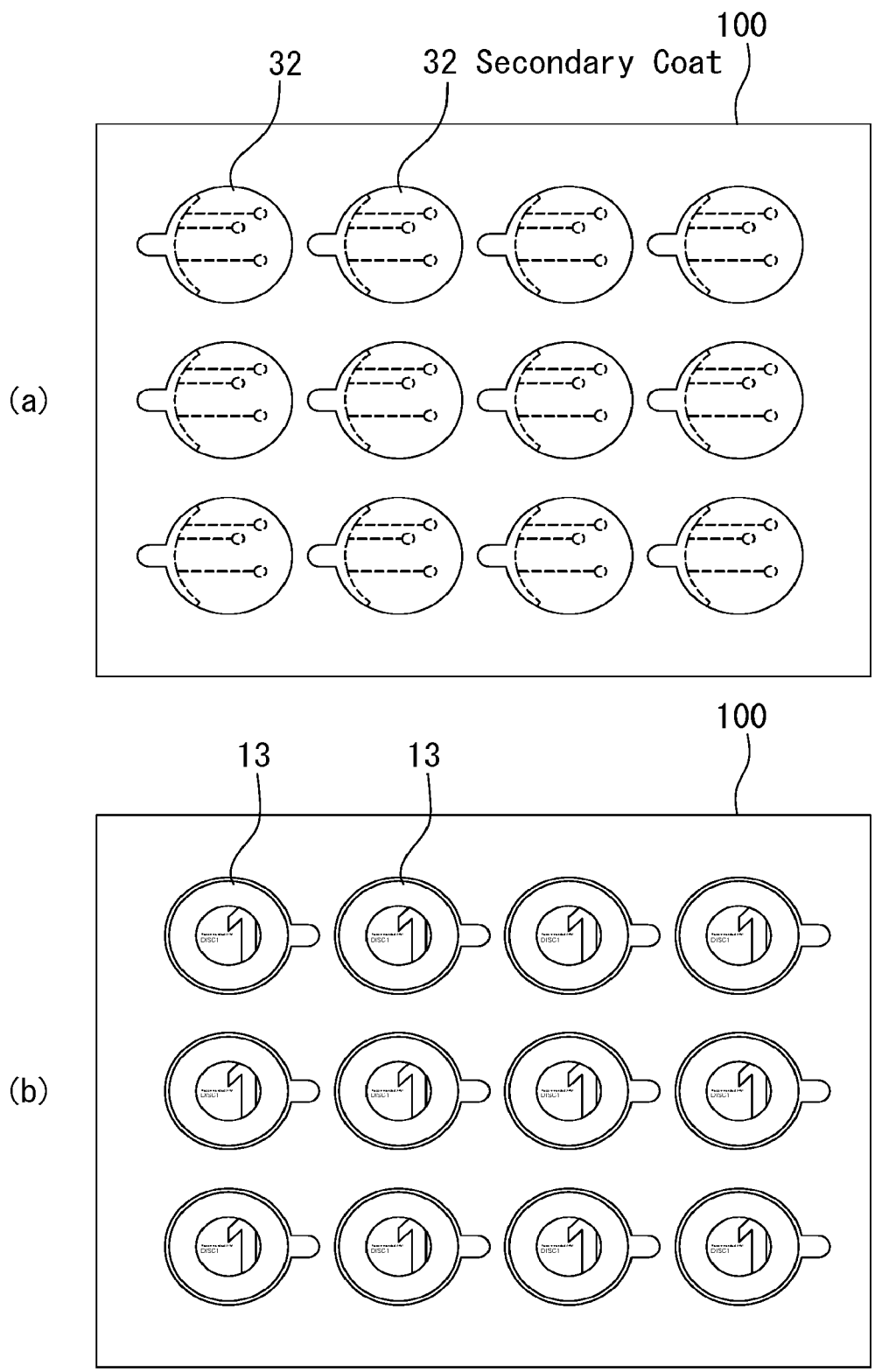
FIG. 5 is a process drawing showing steps of forming the identifier providing device for the computer device according to the first embodiment of the present invention, wherein (a) shows a secondary coat forming step, and (b) shows a pattern forming step.
Figure 6:
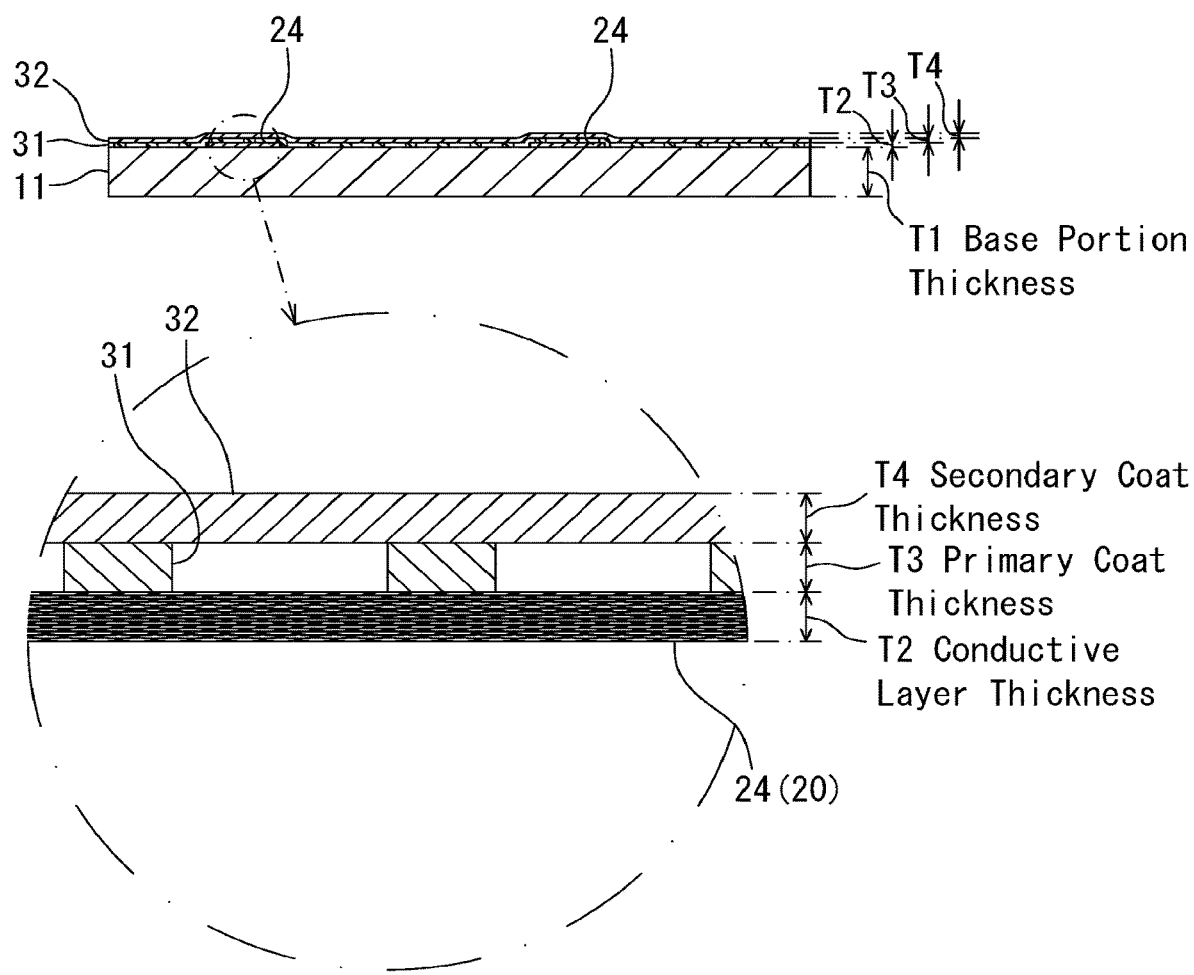
FIG. 6 is a sectional view showing a cross section of a conductive layer pattern (and a cross section of a surface coating) of the identifier providing device for the computer device according to the first embodiment of the present invention.

Next, as shown in FIG. 5 (*a*), in a secondary coat forming step, the secondary coat 32 is printed and formed with a predetermined blue-based printing ink by the screen printing machine, so as to cover the entire inner area of the base material outline, from the top of each secondary coat 31 on the base paper 100. Incidentally, a broken line in FIG. 5 (*a*) is a hidden line that shows the outline of an inner peripheral edge of the extended portion 22 of the conductive layer patterns 20 located below the secondary coat 32 (and the primary coat 31) and the outline of the conductive portion 23 and the PC-side contact portion 24.

<Printing of Pattern Portion 13 at Surface>

Next, as shown in FIG. 5 (*b*), in a pattern forming step, the pattern portion 13 is printed and formed with a predetermined printing ink by the screen printing machine, so as to match each base material outline at the one side (rear surface), on another side surface of the base paper (i.e., a surface to be the front surface of the identifier providing device). In this way, it is possible to form by the screen printing a predetermined number of printed portions (i.e., the pattern portions 13) at the front side of the identifier providing device, as well as printed portions at the rear side (i.e., the conductive layer pattern 20, the primary coat 31, and the secondary coat 32).

<Cut-Out of the Identifier Providing Device (Punching)>

Figure 7:
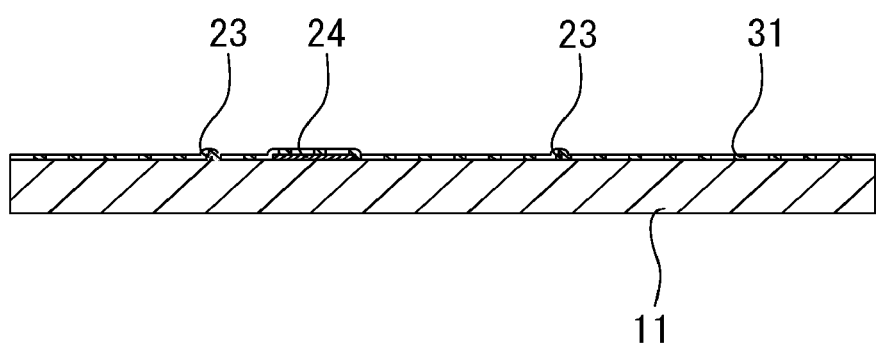
FIG. 7 is a sectional view showing the identifier providing device for the computer device according to the first embodiment of the present invention.
Figure 8:
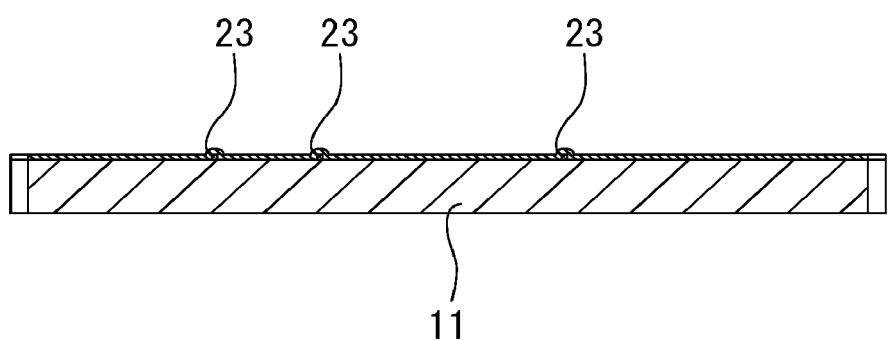
FIG. 8 is a sectional view showing the identifier providing device for the computer device according to the first embodiment of the present invention.
Figure 9:
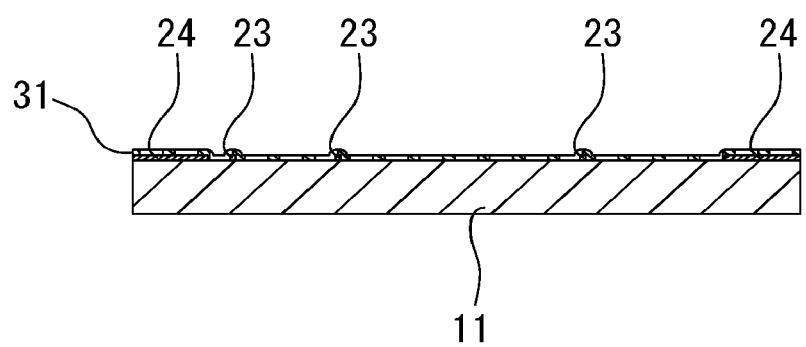
FIG. 9 is a sectional view showing the identifier providing device for the computer device according to the first embodiment of the present invention.
Figure 10:
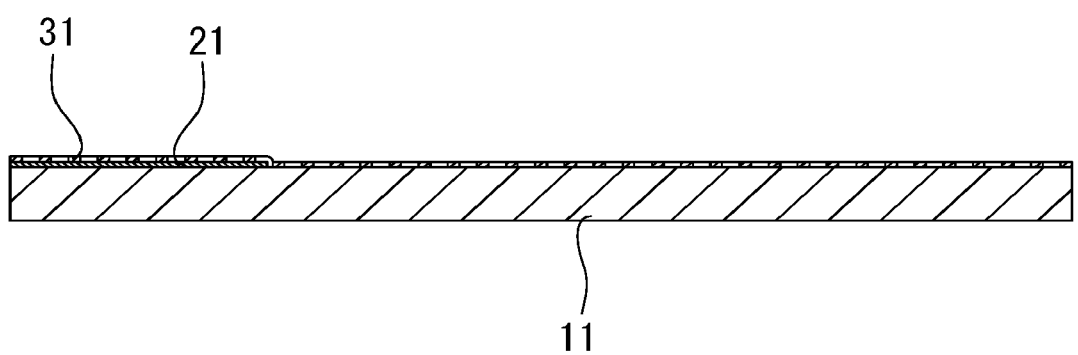
FIG. 10 is a sectional view showing the identifier providing device for the computer device according to the first embodiment of the present invention.
Figure 11:
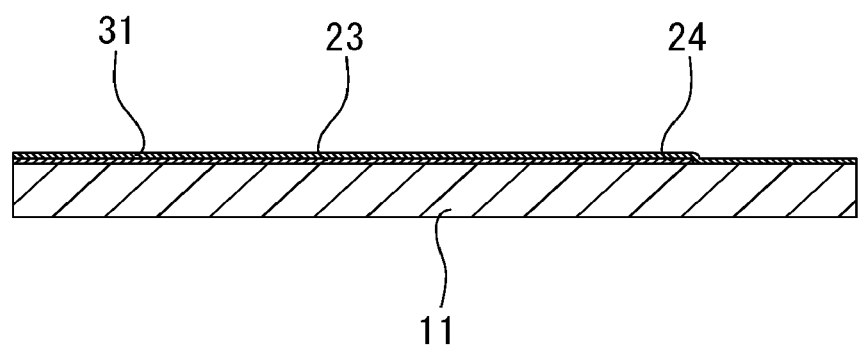
FIG. 11 is a sectional view showing then identifier providing device for the computer device according to the first embodiment of the present invention.

Then, the predetermined number of identifier providing devices shown in FIG. 5 (*b*) are cut out (or punched) by a predetermined cutout device (or punching device) (not shown) along the base material outline. Thus, the identifier providing device as a final product is completed. In this way, the completed identifier providing device has the conductive layer pattern 20 stacked and formed on the base material 10 in a predetermined film thickness and so as to be a predetermined wired pattern, as shown in FIG. 7 (transverse sectional view of the identifier providing device including a cross-section of the conductive portions 23 and the PC-side contact portion 24), FIG. 8 (transverse sectional view of the identifier providing device including a cross-section of the conductive portion 23, FIG. 9 (transverse sectional view of the identifier providing device including a cross-section of the conductive portions 23 and the PC side contact portion 24), FIG. 10 (longitudinal sectional view of the identifier providing device including a cross-section of the finger contact portion 21), and FIG. 11 (longitudinal sectional view of the identifier providing device including a cross-section of the conductive portion 23 and the PC-side contact portion 24). Incidentally, as shown in FIGS. 7 to 10, although the primary coat 31 is laminated on the conductive layer pattern 20, the secondary coat 32 is further laminated and formed on the top of the primary coat 31 (although not drawn in FIGS. 7 to 10).

[Characteristic Construction of Production Method (One of Characteristics of the Present Invention)]

<Binder for Silver Paste Ink>

In the production of the identifier providing device of the present embodiment, the silver paste ink to be the raw material ink for forming the conductive layer pattern 20 contains selected silver flake 50 dispersed in a predetermined binder. As the binder for dispersing the selected silver flake 50, a mixture of a polyurethane resin and a heat resistant resin is used. The binder is blended in the silver paste ink as the raw material ink at a predetermined blending ratio. The blending ratio of the binder is set in accordance with a blending ratio (or content rate) of the selected silver flakes 50 in the silver paste ink and a blending ratio (or addition rate) of a diluent. For example, as described below, when the blending ratio of the selected silver flakes 50 is any given value within the range of 30 to 45 wt % and when the blending ratio of the diluent is any given value within the range of 3 to 5 wt %, the blending ratio of the binder may be set at any given value within the range of 50 to 67 wt %. In the identifier providing device of the present invention (including the present embodiment), since the binder of the silver paste ink is constituted by the mixture of the polyurethane resin and the heat resistant resin. Accordingly, in a state of a product wherein the printed conductive layer paste 20 is printed (and the shielding layer is printed) on the base material 10, even if the base material 10 is bent largely (in an extreme case, even if it is bent 180 degrees), no crack or damage or the like occurs at the conductive layer pattern 20 (in particular, at the selected silver flakes 50 being in electrically connected states with each other as mentioned below, and their connecting portions). Consequently, the conductive layer pattern 20 maintains its original good conductivity. It is though that this is primarily caused by the binder containing the polyurethane resin, thereby imparting sufficient flexibility to the conductive layer pattern 20. It is also thought that this is caused by that, when forming the conductive layer by heating the silver paste ink printed on the base paper 100 in a heating and drying step described later, the heat-resistant resin in the binder exhibits heat resistance and maintains a flexibility of the polyurethane resin in the binder after heating (and the binder in a form of the product), thereby improving a bending resistance of the conductive layer pattern 20 of the identifier providing device. In other words, in the identifier providing device of the present invention, the binder of the silver paste ink gives a very large bending resistance to the conductive layer pattern 20 by a synergistic effect of the polyurethane resin and the heat-resistant resin, thereby preventing the conductive layer pattern 20 from being disconnected (i.e., keeping a predetermined conductivity).

<Content Rate of Solvent in Silver Paste Ink>

In the production of the identifier providing device of the present embodiment, the silver paste ink used as the raw material ink for forming the conductive layer pattern 20 is not one as in the conventional conductive paste ink in which a conductive paste (i.e., the silver paste in the case of this embodiment) is diluted by a solvent at a considerable dilution ratio (e.g., several tens of wt % to several hundreds of wt %). The silver paste ink adds the diluent only at a very limited amount. In detail, because the silver paste ink as a stock solution has a high viscosity, if it is used as it is, a printing speed is greatly reduced. Thus, there is a request of diluting the silver paste ink as the stock solution at a similar dilution rate to the conventional one. However, the present inventors have confirmed that, when such the stock solution is diluted at such dilution ratio similar to the conventional one, although it is possible to print on the base paper 100, it is impossible to obtain a desired conductivity, and the conductivity is decreased as the dilution ratio becomes higher, thereby causing the final conductive layer pattern 20 to be non-conductive. Further, it is also confirmed that, if the stock solution of the silver paste ink is diluted at the dilution ration similar to the conventional one, even if thus formed conductive layer pattern can obtain some degree of electrical conductivity (conductive degree), when the conductive layer pattern 20 of the identifier providing device of the present invention is opposed to and closely contacted with the capacitive touch device of the touch-type computer device, a sufficient capacitance cannot be obtained to drive the capacitive touch device.

Therefore, in the manufacture of the identifier providing device of the present invention, the silver paste ink as the stock solution adds a prescribed diluent at a very limited amount (i.e., at a very limited addition rate). Specifically, in the present invention, as the diluent of the silver paste ink of the stock solution, an ethylene glycol monobutyl ether (also known as butyl cellosolve or Buchisero) (molecular formula $C_6H_{14}O_2$) is used. Also, the addition rate of the diluent is a very limited (very small) addition rate within a range of 3 to 5% (wt %). If the dilution rate of the diluent is more than 5%, the conductivity of the conductive layer pattern 20 of the identifier providing device becomes lower than an expected value, so that it is possible that, when the conductive layer pattern 20 is opposed to and closely contacted with the capacitive touch device, a sufficient capacitance cannot be obtained to drive the capacitive touch device. On the other hand, if the dilution ratio of this diluent is less than 3%, there takes problems such as difficulty of the printing itself on the base paper 100 and a reduced productivity due to the decrease of the printing speed, since the viscosity of the silver paste ink is too high as the stock solution. The present inventors have confirmed that it is possible to achieve both the sufficient printing speed for the mass production of the identifier providing device after manufacture and the desired conductivity of the identifier providing device by the very small addition rate at this level (3 to 5%).

<Content of Silver Particles (Silver Flakes) in Silver Paste Ink>

In the conventional silver paste ink, in general, in order to obtain a $10^{-5}$ $\Omega$cm that is a desired specific resistance (volume resistivity), the content rate of the silver particles (any case of spherical silver particles and flake silver particles) is set in a range of 80 to 90%. If the content rate is lower this, it is impossible to obtain $10^{-5}$ $\Omega$cm that is the desired specific resistance (volume resistivity).

In contrast, in the identifier providing device of the present invention (including the present embodiment), the content rate of the selected silver flakes 50 in the silver paste ink is set in a range of 30 to 45% (wt %) in its manufacture, or it adopts a content rate of 30% as a minimum amount (lower limit). Incidentally, in consideration of variations in print quality, as the safe content rate range for obtaining $10^{-5}$ $\Omega$cm as the desired specific resistance (volume resistivity), the content rate of the selected silver flakes 50 is set in a range of 40 to 45% (wt %). With the identifier providing device of the present invention, the present inventors have confirmed that, despite the use of the silver paste ink at such less content rate of the selected silver flakes 50, the conductive layer pattern 20 produced by the silver paste ink is able to obtain a value of or a value approximating to $a \times 10^{-5}$ $\Omega$cm (where "a" is any real number in a range of not less than 1 and less than 10), for example, $1.0 \times 10^{-5}$ $\Omega$cm, as the desired specific resistance (volume resistivity) that is required to obtain a reliable conductivity. (Incidentally, the specific resistance of the bulk silver is $1.59 \times 10^{-6}$ $\Omega$cm, and the specific resistance of the conductive layer pattern 20 of the identifier providing device of the present embodiment (including the embodiment) becomes a sufficiently good value even as compared with the specific resistance of the bulk silver.)

<Production Parameters (Raw Material Viscosity, Squeegee Speed, Printing Pressure, Attack Angle)>

Next, as shown in the following drawing (FIG. 14), in the conductive pattern forming step, when the conductive pattern 20 is screen-printed on the base paper 100 with the silver paste ink by the screen printing machine, the present invention sets the manufacturing parameters of the screen printing to predetermined values including ink conditions of the raw material ink such as a viscosity of the raw material ink (silver paste ink added with a predetermined diluent at a predetermined limited addition rate), and screen conditions of a mesh or the like of the screen, as well as printing conditions such as a printing speed (squeegee speed), a printing pressure, and an attack angle (of the squeegee).

In detail, in the screen printing process of the identifier providing device of the present invention, as the ink conditions of the material ink, as described above, the selected silver flakes 50 are blended at a predetermined blending ratio into the binder containing a predetermined blending ratio of the polyurethane resin and the heat-resistant resin so as to prepare a stock solution of the silver paste ink, while using a silver paste ink (after adjusting the viscosity) obtained by diluting the stock solution of the silver paste ink at the very limited dilution ratio with a predetermined diluent.

Moreover, as the screen condition, a predetermined screen 110 is used to have a predetermined mesh size (e.g., any mesh size within a range of 100 to 500 mesh) and a predetermined gauze thickness. As the screen 110, a screen 110 is used to have a mesh size of an opening diameter through which the selected silver flakes 50 of a largest particle size (e.g., the one having 5 μm) passes. The screen 110 is masked by a mask portion 111 so as to form a predetermined conductive layer pattern 20. That is, the screen 110 forms a mask opening 112 corresponding to a predetermined conductive layer pattern 20 by the mask portion 111 of the screen 110.

Further, as the printing condition, a squeegee 120 is used to have a predetermined material (e.g., polyurethane rubber having a hardness of any value of hardness in a range of 60 to 90 degrees, or a silicon) and a predetermined form (for example, a flat shape).

Figure 15:
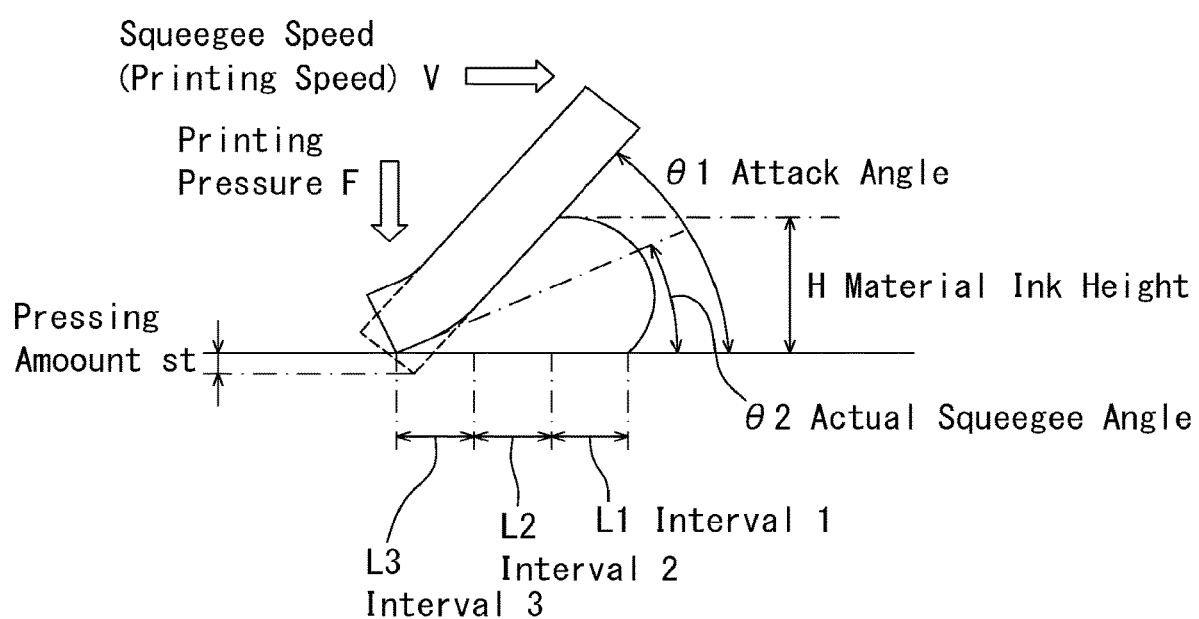
FIG. 15 is an explanatory drawing showing manufacturing parameters (raw material viscosity, squeegee speed, printing pressure, attack angle) in the conductive pattern forming step (screen printing) of the identifier providing device for the computer device according to the first embodiment of the present invention.

Moreover, as the printing condition, as shown in FIG. 15, the attack angle θ1 of the squeegee 120 is set at a predetermined angle. The attack angle θ1 may be any value within a range not more than 70 degrees, for example. It may be a considerably smaller angle than the angle of 70 degrees, such as an angular range of 30 to 35 degrees, an angular range of 35 to 40 degrees, an angular range of 40 to 45 degrees, an angular range of 45 to 50 degrees, in order for the silver paste ink of the present invention (including the present embodiment) that is to be a high viscosity to be filled smoothly in the mask opening 112 of the screen 110. Furthermore, as the printing condition, the printing pressure F is set at a predetermined pressure so that, in relation to the hardness of the squeegee 120 (and an elastic modulus determined depending on the hardness), the actual squeegee angle θ2 is maintained at a smaller predetermined angle than the attack angle θ1 at the time of printing. In the present invention (including the present embodiment), in order to increase a filling performance of the silver paste ink having a high viscosity of the present invention into the screen 110, the printing pressure F and the hardness of the squeegee 120 may be set such that, rather than the attack angle θ1, the actual squeegee angle θ2 is set at a considerably smaller angle than the angle of 70 degrees, such as an angular range of 30 to 35 degrees, an angular range of 35 to 40 degrees, an angular range of 40 to 45 degrees, an angular range of 45 to 50 degrees. Further, as the printing condition, the squeegee speed (printing speed) V is set at a predetermined speed. For example, the squeegee speed V may be in a range of 1 mm-100 mm/sec. Preferably, for improving the printing quality of the silver paste ink having a high viscosity as well as enhancing the mass productivity, it may be set in a range in consideration of a balance of the both, for example, such as 1-5 mm/sec, 5-10 mm/sec, 10-15 mm/sec, 15-20 mm/sec, 20-25 mm/sec, 25-30 mm/sec, 30-35 mm/sec, 35-40 mm/sec, 40-45 mm/sec, or 45-50 mm/sec.

Figure 14:
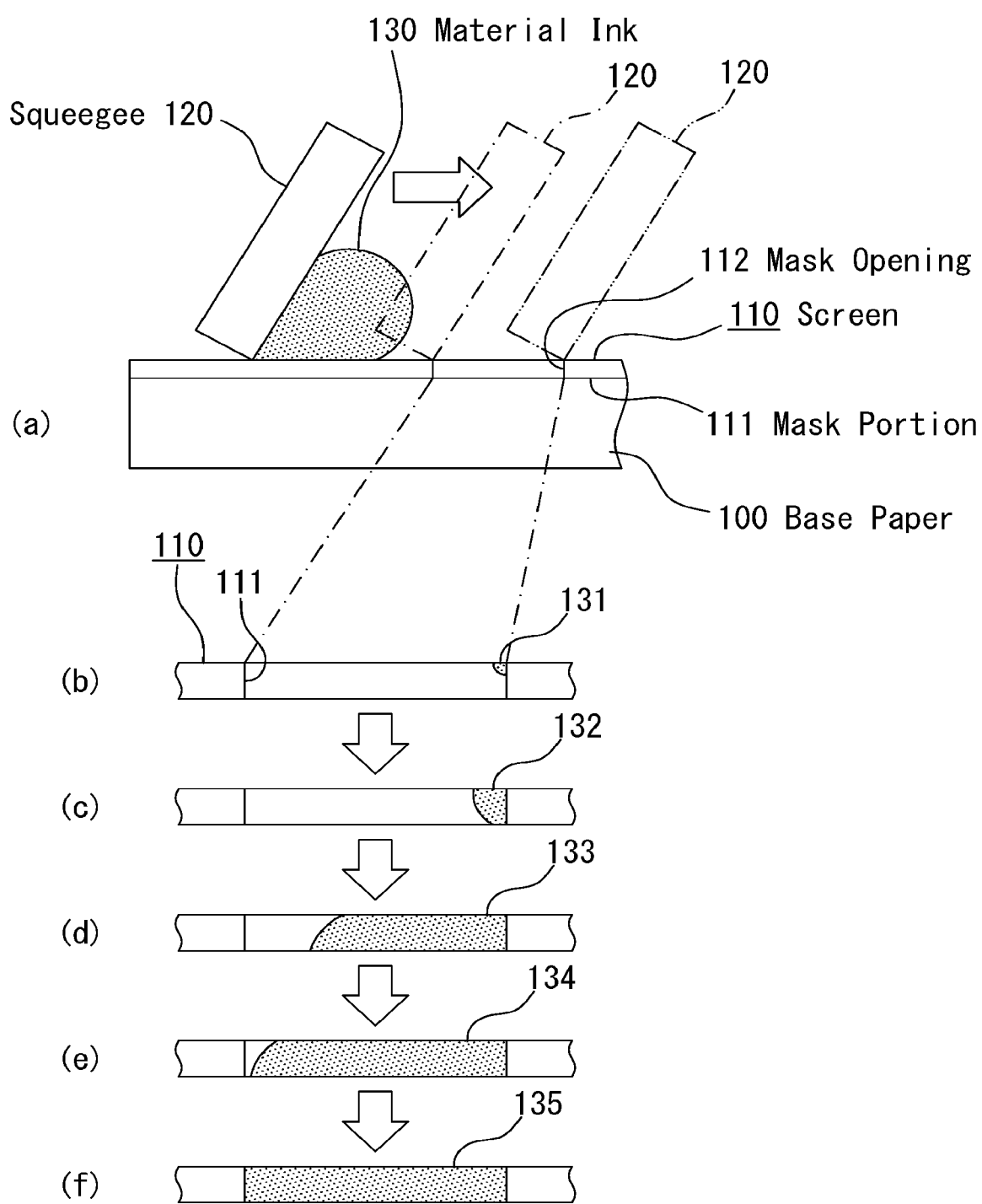
FIG. 14 is an explanatory drawing showing a conductive pattern forming step (screen printing) of the identifier providing device for the computer device according to the first embodiment of the present invention.

In the screen printing on the above-mentioned printing conditions, for example, as shown in FIG. 14, the raw material ink 130 composed of the silver paste ink is filled in the mask opening 112 of the screen 110, while rolling with a movement of the squeegee 120. At this time, as shown in FIG. 14, the raw material ink 130 is rolled on the mask opening 112 from a position immediately in front of the mask opening 112 of the screen 110 (position of FIG. 14 (a)). Then, first of all, the raw material ink 130 is contacted with a wall surface at a back side of the mask opening 112. Thereby, by its contact resistance, the raw material ink 130 is filled from the wall surface portion of the back side (i.e., starts being filled from the portion at an interval 1L1 in FIG. 15). Next, the raw material ink 130 is further rolled on the mask opening 112 to be sequentially filled from the back side toward a front side of the mask opening of the screen 110 in FIG. 14. The raw material ink 130 reduces its viscosity (by its thixotropy) by rolling (rotational moving) on the mask opening 112, so that the raw material ink 130 is easily and smoothly filled into the mask opening 112.

Here, as shown in FIG. 15, at the interval 1L1 of the mask opening 112 of the screen 110 (portion at the back side), the squeegee speed V and a material ink height H (affected by the attack angle θ1) have a large influence on a filling efficiency of the raw material ink 130 into the interval 1L1. On the other hand, at the interval 3L3 of the mask opening 112 (portion at the front side), the squeegee speed V, the attack angle θ1, and the actual squeegee angle θ2 have a large influence on the filling efficiency of the raw material ink 130 into the interval 3L3. At the interval 2L2 of the mask opening 112 (middle portion in a moving direction of the squeegee 120), a pushing amount st (determined by the printing pressure F or the flexibility of the screen 110 itself) and the printing pressure F have a large influence on the filling efficiency of the raw material ink 130 into the interval 2L2. Thus, the present invention (including the present embodiment) sets at an optimum value each of the parameters such as the squeegee speed V, the attack angle θ1, and the actual squeegee angle θ2, in order to perform a uniform and efficient ink filling operation at the interval 1L1, the interval 2L2 and the interval 3L3 of the mask opening 112 of the screen 110.

Figure 16:
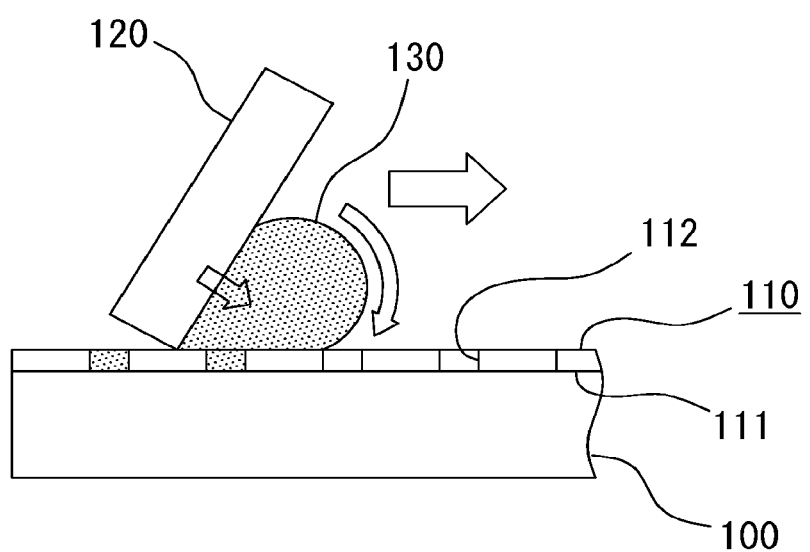
FIG. 16 is an explanatory drawing showing a screen printing in the conductive pattern forming step of the identifier providing device for the computer device according to the first embodiment of the present invention.

As described above, since the silver paste ink is screen-printed on the base paper 100 with the squeegee 120, as shown in FIG. 16, the raw material ink 130 is rolled to be filled in each of the mask openings 112 of the screen 110, thereby being printed on the printing surface of the base paper 110 below the screen 110.

Figure 17:
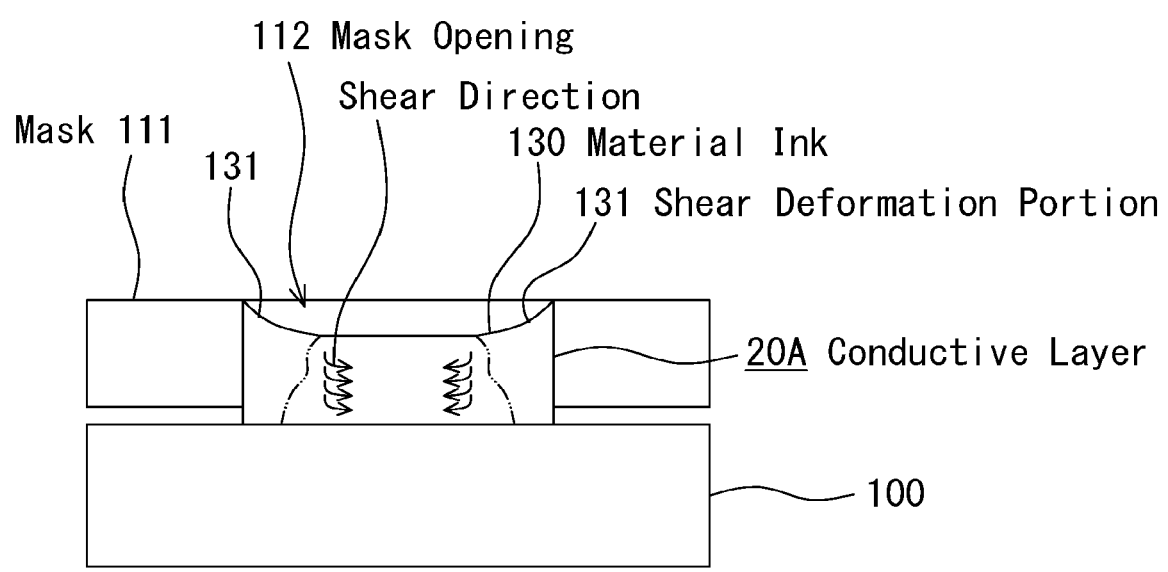
FIG. 17 is an explanatory drawing showing the conductive pattern forming step (screen printing) of the identifier providing device for the computer device according to the first embodiment of the present invention.
Figure 18:
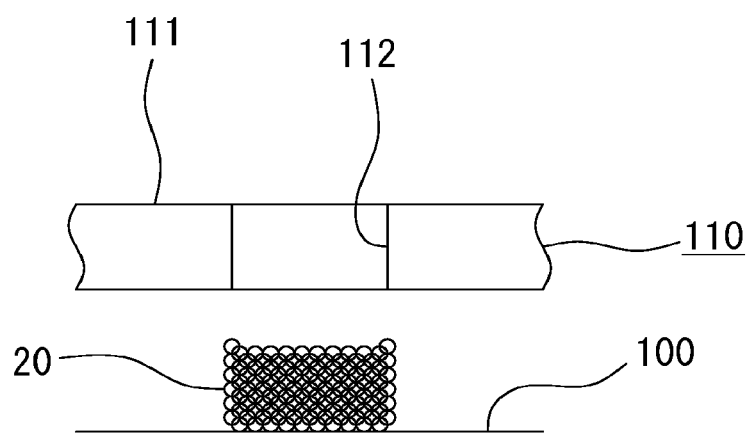
FIG. 18 is an explanatory drawing showing the conductive pattern forming step (screen printing) of the identifier providing device for the computer device according to the first embodiment of the present invention.

At this time, as shown in FIG. 17, during a plate separating operation by a printing gap in the screen printing, when the plate separating starts, the raw material ink 130 within the mask opening 112 of the screen 110 generates a shear deformation section 131 due to a shear stress in a shear direction against the wall surface of the mask opening 112. Therefore, the raw material ink 130 is smoothly pulled out of the mask opening 112 by the viscosity reduction (by thixotropic property) due to the shear deformation force at this shear deformation section 131, thereby being printed as a conductive layer 20A on the surface of the base paper 100.

As a result, as shown in FIG. 17, at the time of complete plate separation of the screen 110, the conductive layer 20A is printed in a predetermined pattern on the surface of the base paper 100, thereby finally forming a predetermined pattern shape of conductive layer pattern 20 on the base paper 100.

<Printing Direction>

In the present invention (including the present embodiment), in the above-mentioned screen printing, the length of the base paper 100 shown in FIG. 4 (a) (in the figure the left-right direction), the conductive layer pattern 20 straight conductive portions 23 so that the longitudinal direction coincides, the screen 110 is masked by the mask 111, a mask aperture 112, performs screen printing by the screen 110. Accordingly, at the time of screen printing, since the moving direction of the squeegee 120 coincides with a length direction of a portion at the conductive portion 23 of the mask opening 112 of the screen 110, it is possible to print multiple conductive layer patterns 20 on the base paper 100 smoothly and at a high quality.

[Characteristic Construction of Conductive Layer Pattern (Principal Characteristic of the Present Invention)]

Figure 12:
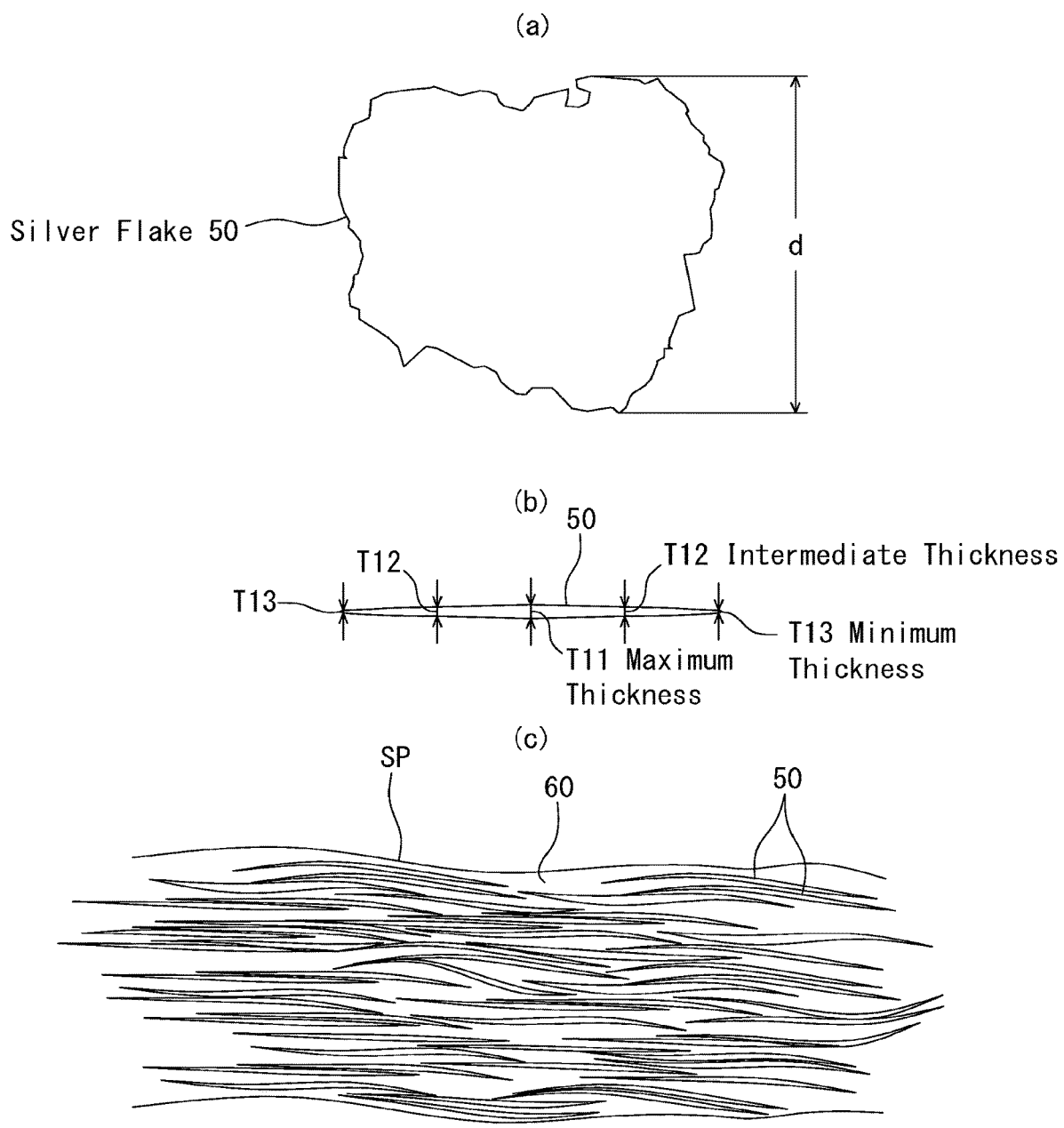
FIG. 12 is an explanatory drawing representing silver flakes for forming the conductive layer pattern of the identifier providing device for the computer device according to the first embodiment of the present invention.

As the silver particles of the silver paste for forming the conductive layer pattern 20, the identifier providing device of the present embodiment uses the selected silver flakes 50 that are the silver flakes consisting of scale-like, flaky or flake-like silver particles as shown in FIG. 12 (a) and that are obtained by preparation and/or selection to have a minimum thickness and a uniform particle size. Incidentally, the outer contour of the selected silver flake 50 shown in the same figure is merely schematic. The actual selected silver flake 50 has a scaly shape of a variety of outer contours that is not defined as a fixed shape, as in the conventional silver flake. The selected silver flakes 50 are flaky particles (except for impurities) of substantially 100% silver (pure silver). In addition, it is not desirable to form the selected silver flakes 50 of the silver paste for forming the conductive layer pattern 20 from a silver material (i.e., silver alloy) other than a fine silver (100% silver). That is, with such a silver material (other than the fine silver), it is difficult to keep the shape of the silver flake at a predetermined flake shape described later. Thus, the selected silver flakes 50 of the silver paste for forming the conductive layer pattern 20 need to be formed by the silver material of 100% silver. Moreover, there is a copper or a copper-containing silver alloy as a highly conductive material other than the silver. However, these metallic materials are hard to obtain similar characteristics (primarily a property due to its thickness) to the selected silver flakes 50 made of the fine silver of the present embodiment. That is, the pure silver has a good malleability/ductility, so that it can keep an average thickness required for the conductive layer pattern 20 of the present invention at a predetermined thickness described later (typically, average thickness of about 50 nm) so as to exert specific effects on the conductive layer pattern 20 of the present invention described below. However, the other metallic materials (except a gold) cannot keep the average thickness required for the conductive layer pattern 20 of the present invention at such extremely small thickness. On the other hand, the gold is richer in malleability/ductility than the silver, so that it is more preferred to keep the average thickness at the extremely small thickness. However, since the gold is considerably more expensive than the silver, it is preferable to use the silver in view of the cost. Furthermore, the silver is slightly better than the gold in terms of the specific resistance (resistivity), it is preferable to use the silver in terms of the electrical conductivity, too. (Specific resistance: gold=$2.21 \times 10^{-8}$ $\Omega$m ($2.21 \times 10^{-6}$ $\Omega$cm), silver=$1.59 \times 10^{-8}$ $\Omega$m ($1.59 \times 10^{-6}$ $\Omega$cm).)

<Average Thickness of Each Selected Silver Flake of Silver Paste>

As described above, the silver flakes for forming the conductive layer pattern 20 of the identifier providing device of the present invention and the present embodiment consist of the selected silver flakes 50 obtained by preparation/selection such that they have a predetermined small thickness and a substantially uniform particle size (very limited size range). The silver flakes contains no silver particles other than the selected silver flakes 50. The selected silver flakes 50 have an average thickness as measured by, for example, a scanning electron microscope (SEM) observation at the predetermined thickness (typically about 50 nm). As the selected silver flakes 50, it is theoretically possible to use the silver flakes having an average thickness smaller than 50 nm. However, in practice, it is preferable to use the ones having the average thickness of about 50 nm in view of difficulty in producing silver flakes having a thickness smaller than 50 nm (production difficulty), manufacturing cost, mass productivity and so on. Here, with respect to 50 nm as the average thickness of the selected silver flake 50, it is very difficult to measure a thickness of one sheet of the selected silver flake having such a very small thickness. Thus, it is calculated by measuring a total thickness of a collection of a predetermined number (e.g., ten sheets) of the selected silver flakes 50 in the stacked state by SEM observation, for example, among a large number of sheets of the selected silver flakes 50 in a stacked state, and by dividing the total thickness by the predetermined number of the sheets. For example, the total thickness of the collection of the selected silver flakes 50 consisting of 10 sheets as the number of the stacked sheets becomes about 500 nm by the SEM observation, so that the average thickness of one sheet of the selected silver flake 50 is calculated as about (500 nm/10=) 50 nm.

<Average Thickness and Thickness Distribution of Each Selected Silver Flakes of Silver Paste (Presence of Extremely Small Thickness Portion)>

Each selected silver flake 50 has the average thickness of about 50 nm as a typical example of the predetermined average thickness. Still, in some cases, it may have a predetermined range having a certain width upwardly from 50 nm as a practical lower limit, such as a range of 50 nm to 60 nm, a range of 50 nm to 55 nm range, etc. Moreover, as shown in FIG. 12 (*b*), basically, each selected silver flake 50 does not have the uniform thickness in its entirety including a center part or an end part thereof. It has different thicknesses depending on regions. Specifically, if describing the selected silver flake 50 in a schematically simplified way, it has a maximum thickness portion of a maximum thickness T1, a extremely small thickness portion of a minimum thickness T3, and an intermediate thickness portion of an intermediate thickness T2 (intermediate thickness between the maximum thickness T1 and the minimum thickness T3). The maximum thickness T1 is larger than the average thickness (about 50 nm) of the selected silver flake 50. For example, it is up to approximately 100 nm (typically in a range of 50 nm to 100 nm). Also, the minimum thickness T3 is smaller than the average thickness. For example, a smallest thickness thereof is about 25 nm (typically in a range of 30 to 50 nm, and smaller ones may be in a range of 20 to 40 nm, 25 nm to 35 nm, or 20 nm to 30 nm). The extremely small thickness portion of the minimum thickness T3, as an extremely small thickness portion, is basically present at an outer peripheral edge portion of the selected silver flake 50. Still, it is though that it is present in some cases at a central side portion (in an extreme case, a central portion) from the outer peripheral edge portion. Incidentally, FIG. 12 (*b*) is an explanatory view for illustrating a thickness distribution of such selected silver flakes 50 in a schematically simplified way. Thus, for convenience sake of explanation, the maximum thickness T1 is illustrated at a portion of a central position of the selected silver flake 50, and the minimum thickness T3 is illustrated at a portion of a position near the outer peripheral edge, while the intermediate thickness T2 being illustrated at a portion of an intermediate position between the center position and the position near the outer peripheral edge. Still, as described above, the maximum thickness T1, the intermediate thickness T2, and the minimum thickness T3 are not necessarily present at the center position, the intermediate position and the position near the outer peripheral edge, respectively. They may exist at different positions in some cases.

<Characteristic According to Extremely Small Thickness Portion of Each Selected Silver Flake of Silver Paste>

In any case, as described later, the present invention (including the present embodiment) utilizes all parts (hereinafter may be referred to as "extremely small thickness portion") of the selected silver flake 50 having the extremely small thickness to be not more than the average thickness (preferably, as described above, 50 nm or less), so as to partially melt the extremely small thickness portion between the selected silver flakes 50 in the stacked state with each other and being adjacent or being closely contacted by heating at a predetermined first heating temperature range (for a heating treatment of the silver paste), thereby to achieve welding between their extremely small thickness portions. It is one of the principal features of the present invention. Incidentally, this "partial melting" is used to mean that at least the "extremely small thickness portion being in a molten" state (i.e., the other portions having a greater thickness being basically not in the "molten" state). That is, the first heating temperature range is a temperature range in which at least the extremely small thickness portion of the selected silver flake 50 becomes a molten state (i.e., a "partial melting" state). A lower limit thereof is about 200° C. Typically, an upper limit thereof is set at about 300° C. Thus, the temperature range may be set at a variety of temperature ranges such as a temperature range of about 200° C. to about 300° C., a temperature range of about 200° C. to about 250° C., a temperature range of about 200° C. to about 230° C., a temperature range of about 230° C. to about 300° C., a temperature range of about 230° C. to about 250° C., a temperature range of about 250° C. to about 300° C. Incidentally, such a first heating temperature range may be referred to hereafter as "partial melting temperature range" for convenience sake of description. In addition, the present inventors have confirmed by experiments or the like that, among the partial melting temperature ranges, in a temperature range of less than about 230° C. (i.e., the temperature range of about 200° C. to about 230° C.), it is possible that, in a greater or lesser degree, there remains a portion not in the "partial melting" state at the extremely small thickness portion of the selected silver flake 50. Still, the present inventors have confirmed by experiments or the like that, in the temperature range with the lower limit value of about 230° C. (i.e., a temperature range not lower than about 230° C.), a rate at which the extremely small thickness portion of the selected silver flake 50 becomes the "partial melting" state, can significantly increase. Moreover, the present inventors have confirmed by experiments or the like that, in the temperature range with the lower limit value of about 250° C. (i.e., a temperature range not less than about 250° C.), the rate at which the extremely small thickness portion of the silver flake 50 becomes the "partial melting" state, can be nearly 100% or 100%.

Thereby, by heating in the partial melting temperature range, the adjoining selected silver flakes 50 in the silver paste of the raw material ink 130 coated on the base paper 100 are partly molten at least at those extremely small thickness portions and are partly welded (partial welding) at the extremely small thickness portions. Thus, through the welded portion (partial welded portion) between those extremely small thickness portions, an electrical conductivity (and property of specific resistance) between the adjacently disposed silver flakes 50 is dramatically improved. Finally, the specific resistance of the conductive layer pattern 20 in which a number of selected silver flakes 50 are in the stacked state, becomes 20 a desired value of specific resistance (specific resistance value on an order of $10^{-5}$ Ωcm). Incidentally, the extremely small thickness portion of the selected silver flake 50 is typically a minimal thickness portion with the minimum thickness T3. In addition thereto, the extremely small thickness portion is also constituted by the intermediate thickness portion, the portion between the intermediate thickness portion and the minimal thickness portion where a thickness thereof becomes 50 nm or less, and the portion between the intermediate thickness portion and the maximum thickness portion where a thickness thereof becomes 50 nm or less.

Also, the selected silver flakes 50 of the present invention (including the present embodiment) becomes a softened state (though not the "partial melting" state) or a state closer to the molten state, particularly at the extremely small thickness portion, even by heating in a predetermined second heating temperature range that is a temperature range lower than the first temperature range. Then, the selected silver flakes 50 disposed adjacently in the silver paste are readily softened and deformed at least at those extremely small thickness portions to be partially aggregated (partial aggregation) at the extremely small thickness portions. Thereby, through aggregated portions (partial aggregation portions) between those extremely small thickness portions, the electrical conductivity (and property of specific resistance) between the selected silver flakes 50 that are disposed adjacently is greatly improved (although lower than the case of the "partial fusing"). Finally, they function such that the specific resistance of the conductive layer pattern 20, in which a large number of selected silver flakes 50 are stacked, reaches a desired specific resistance value (specific resistance value on the order of $10^{-5}$ Ωcm). The second heating temperature range is a temperature range at which at least the extremely small thickness portion of the selected silver flake 50 becomes softened aggregation state (i.e., becomes a "partial aggregation" state). An upper limit value thereof is a temperature value less than 200° C., while a lower limit value thereof being a temperature value of about 80° C. Typically, it may be a temperature range of about 80° C. to about 200° C., preferably, a temperature range of about 80° C. to about 180° C., and, more preferably, a temperature range of about 80° C. to about 150° C. Alternatively, the second heating temperature range may be other temperature ranges such as a temperature range of about 150° C. to about 200° C., a temperature range of about 150° C. to about 180° C., a temperature range of about 80° C. to about 130° C. Incidentally, such a second heating temperature range may be referred to hereafter as "partial aggregation temperature range" for convenience sake of description.

Further, the present invention utilizes an ultra-small thickness of all portions in the selected silver flake 50 at which the thickness is in a range of 25 nm to 35 nm, 20 nm to 30 nm, or 20 nm to 35 nm (hereinafter may be referred to as "ultra-small thickness portion"). That is, the ultra-small thickness portions are partially melted (or an entirety of the ultra-small thickness portions is completely melted) more reliably at the partial melting temperature range between the selected silver flakes 50, which are adjacently contacted or cohered and which are in the stacked state with each other. Thus, the welding between those ultra-small thickness portions is achieved. It is one of the main characteristics of the present invention. In this way, through the welded portions between those ultra-small thickness portions (in addition to the partial welded portions at the extremely small thickness portions), the electrical conductivity (and property of specific resistance) between the selected silver flakes 50 disposed adjacently is drastically improved. Finally, the specific resistance of the conductive layer pattern 20, in which a number of selected silver flakes 50 are in the stacked state, becomes a desired specific resistance value (specific resistance value on the order of $10^{-5}$ Ωcm). Incidentally, it is thought that, in most cases, the ultra-small thickness portion of the selected silver flake 50 is typically the minimal thickness portion of the minimum thickness T3. Still, it is though that, as in the case of the extremely small thickness portion, in addition thereto, there is a greater than zero possibility that the intermediate thickness portion or other portions be the ultra-small thickness portion.

<Particle Size and Particle Size Range of Selected Silver Flake of Silver Paste (Substantially Uniform Particle Size)>

The selected silver flake 50 of the silver paste to form the conductive layer pattern 20 consists only of, for example, silver flakes in which the particle size measured by the scanning electron microscope (SEM) observation is very small and falls within a very limited size range (typically a small particle size range from about 3.5 to about 4.5 μm, hereafter may be referred to as "extremely small and limited particle size range"). Basically, the selected silver flakes 50 contain no silver flakes other than the extremely small and limited particle size range. Only the selected silver flakes 50 of the extremely small and limited particle size range (i.e., having a very small particle size and very narrow particle size distribution) are used as the silver particles. That is, in general, the silver flakes have always some degree of particle size distribution as a product form after the manufacturing. Normally, the particle size distribution has a particle size distribution in a range of at least several μm (at least a variation of 3 μm or more or 4 μm or more). However, the present invention classifies the silver flakes having such particle size distribution to select the particle size, thereby constituting the selected silver flakes 50 by using only the silver flakes having limited particle size within a predetermined range. Then the present invention forms the conductive layer pattern 50 by using the silver paste prepared with only the selected silver flakes 50 in the limited particle size range. In other words, the selected silver flake 50 select and use only the silver paste in which the particle size is included within a very narrow particle size range (typically, in a particle size range of about 1 μm) in a particle size distribution graph (though not shown).

The particle size distribution has a very sharp rise and fall in the particle size distribution graph (specifically, having a particle size distribution that rises substantially perpendicularly and abruptly from a vicinity of a particle size "3.5 μm" in case of the aforementioned limited particle size range, while falling substantially vertically and abruptly in a vicinity of the particle size "4.5 μm"). The particle size of the selected silver flakes 50 having such limited particle size range can be identified, for example, using measurement results by a laser diffraction-scattering-type particle-size/particle-size-distribution measurement method.

<Modified Example of Particle Size and Particle Size Range of Selected Silver Flakes of Silver Paste (Substantially Uniform Particle Size)>

Incidentally, the particle diameter of the selected silver flakes 50 of the present invention is desirably in the range of about 3.5 to about 4.5 μm, as described above. Alternatively, as long as the particle size falls within the limited particle size range (range of approximately 1 μm), another particle diameter may be used, for example, such as a particle size in a range of 3.0 to 4.0, and a particle size in a range of 4.0 to 4.5 μm. However, from a practical point of view including a restriction or the like in terms of a manufacturing technique of the silver flake, the particle size of the selected silver flakes 50 is preferably in the range of about 3.5 to about 4.5 μm, as described above.

<Relationship between Particle Size and Particle Size Range of Selected Silver Flake of Silver Paste>

Further, in the present invention (including the present embodiment), in the particle size range (3.5 to 4.5 μm), the selected silver flakes 50 of the silver paste has a width (ratio) from a median value (4.0 μm) to a maximum value (4.5 μm) that is equal to (0.5/4.0=) 12.5%, while having a same width (ratio) from a median value (4.0 μm) to a minimum value (3.5 μm) that is equal to (0.5/4.0=) 12.5%. Thus, the selected silver flakes 50 have the width of 12.5% at both sides of the medial value, respectively, (width of 25% in total). Still, such point is one of the characteristics of the present invention, too, from the viewpoint of obtaining the aforementioned unique effects (realization of a micro-printing, etc.).

<Features due to Limited Size Range of Selected Silver Flake of Silver Paste>

As described above, in the present invention, the silver paste contains only the selected silver flakes 50 having a particle diameter limited within the aforementioned limited particle size range, and the conductive layer pattern 20 is formed by such silver paste. Thereby, the selected silver flakes 50 to form the conductive layer pattern 20 have the aforementioned very small particle size of about 3.5 μm to about 4.5 μm. On the other hand, the particle size range is concentrated in the aforementioned narrow range (in the range of about 1 μm). Thus, such selected silver flakes 50 can be regarded as a collection of silver flakes in which the substantive particle size is substantially homogenized in the very small particle size (about 3.5 μm to about 4.5 μm). Such selected silver flakes 50 have the small particle size and the homogenized particle size range. Accordingly, in the conductive layer forming step of the conductive layer pattern 20, when the selected silver flakes 50 are contained along with the binder in the silver paste to be screen-printed on the base material 10, they pass easily and smoothly the mask opening of the screen (mesh plate), despite having a scale-like outline. Thus, the selected silver flakes 50 do not interfere with the mesh (gauze) provided at the circumferential edge of the mask opening and are not hindered from passing the mask opening by. Therefore, at this time, there occurs no problem that a part of the selected silver flakes contained in the silver paste cannot pass through the screen and are clogged on the screen. As a result, all the selected silver flakes contained in the silver paste are contained at an inside of the silver paste layer (to form the conductive layer) that is formed by printing on the base material 10. Thus, it is possible to maintain the original packing density of the silver flakes in the silver paste.

That is, the content rate of the selected silver flakes in the silver paste is set at a predetermined content rate (significantly lower than the content rate of the silver particles in the conventional silver paste), as described below. Still, in the present invention, all the selected silver flakes contained in the silver paste are contained in the interior of the silver paste layer formed by printing on the base material 10 (i.e., the content rate thereof is not lowered). Consequently, it is possible to maintain the original content rate of the silver flakes in the silver paste to keep the packing density of the selected silver flakes 50 in the conductive layer at a predetermined density. Thereby, it is possible to exhibit an intended conductive efficiency by the predetermined packing density. In particular, for example, even if a big screen having a large number of mesh is used (that is, a diameter of the mask opening of the screen is very smaller) in order to carry out a fine printing, as in the case in which the conductive portion 23 of the conductive layer pattern 20 is made into a fine width, the selected silver flakes 50 pass smoothly through the mask opening of the screen, despite having the scale-like outline, as in the silver particles of spherical shape. Thus, even in this case, it is possible to maintain the original content rate of the silver flakes in the silver paste to form the conductive layer, thereby keeping the packing density of the selected silver flakes 50 in the conductive layer can at a predetermined density. Consequently, it is possible to print a very fine pattern as the conductive layer pattern 20.

<Content o Rate of Selected Silver Flakes in Silver Paste (Filling Density in Conductive Layer)>

In present invention (including the present embodiment), the silver paste for forming the conductive layer pattern 20 contains the selected silver flakes 50 at the predetermined content rate. Still, as described above, it achieves a sufficiently excellent specific resistance ($10^{-5}$ Ωcm). On the other hand, the silver paste reduces the content rate as compared with the conventional silver paste. Thus, it contributes to reduction of the raw material cost (by reducing a relative amount of the expensive silver). In detail, for example, if the conventional silver paste uses silver particles of spherical shape, the content rate of the silver particles needs to be 80 to 90% in order to obtain a specific resistance of $10^{-5}$ Ωcm level. On the other hand, in the present invention (including the present embodiment), though the silver paste has the content rate of the selected silver flakes 50 in the range of 30 to 45% (wt %), it gains the specific resistance of $10^{-5}$ Ωcm level. It is thought that, since the selected silver flake 50 have the aforementioned extremely small particle size and limited particle size range to reliably keep the predetermined content rate (and the filling rate) in the conductive layer on the screen-printed base material 10, while having the aforementioned extremely small thickness portion or ultra-small thickness portion, as will be described later, partially welded portions are formed between the adjoining selected silver flakes 50 (and/or partially aggregated portions are formed depending on the temperature range), and, in particular, the specific resistance of the conductive layer formed by the partially welded portions is remarkably improved. Thus, even with the content rate of the silver flakes significantly less than the prior art, the conductive layer by the silver paste is able to ensure a desired specific resistance. Here, the content rate of the selected silver flakes 50 in the silver paste may be a content rate of 30% (wt %) (as a minimum necessary amount or a lower limit value), or in a range of 30 to 35%, 35 to 40%, 40 to 45%, or any value within those ranges. On the other hand, the content rate of the selected silver flakes 50 in the silver paste is preferably set in a range of 40 to 45%, or any value within such range (e.g., 40% or 45%) in order to surely obtain the desired specific resistance (specific resistance of at least $10^{-5}$ Ωcm level).

<Stacked State of Selected Silver Flakes of Silver Paste Forming Conductive Layer (Substantially Parallel Stacking)>

As shown in the schematic drawing of FIG. 12 (*c*), the silver paste SP as the raw material of the conductive layer pattern 20 contains the selected silver flakes 50 dispersed at the predetermined content rate in the binder 60. The silver paste SP has a layer form or film form having a predetermined thickness in a state immediately after being printed on the base paper 100 by the screen printing (before heating and drying). Incidentally, when the silver paste is printed on the base paper 100 through the screen by screen printing, the selected silver flakes 50 dispersed in the binder 60 are oriented so as to be substantially parallel to each other in the binder 60 due to a posture change in the binder 60 by its scale shape or the like, as shown in FIG. 12 (*c*). Then, when heating and drying the layer of the silver paste SP on the base paper 100, a volatile component of the binder 60 (and, a diluent in case the silver paste SP contains the diluent) is volatilized, thereby forming the conductive layer of the conductive layer pattern 20. This conductive layer is formed in a thin film shape of the predetermined thickness consisting of a solid content of the binder and the selected silver flakes 50. At this time, in the interior of the conductive layer, the adjoining selected silver flakes 50 have at least a part thereof overlapped due to a contraction stress associated with a solidification shrinkage of the binder (by heating or the like). Thereby, the selected silver flakes have their faces contacted with each other to perform an electric conduction. Alternatively, in the interior of the conductive layer, the adjoining selected silver flakes 50 sometimes come near (though not coming to close contact) and are opposite at a short distance by the contraction stress associated with the solidification shrinkage of the binder 60 with the solid content of the binder 60 held therebetween. Still, in this case, the electric conduction is ensured by insulation breakdown of the binder 60 between the adjacent selected silver flakes 50.

<Partial Fused Structure of Selected Silver Flake in Stacked State in Conductive Layer Pattern>

Further, in the present invention, the conductive layer pattern 20 is formed as a final conductive layer by heating the silver paste SP on said base paper 100. The selected silver flakes 50 inside the conductive layer pattern 20 have a thickness from the maximum thickness T1 to the minimum thickness T3, as mentioned above. Then, the selected silver flakes 50 inside the conductive layer pattern 20 are welded or fused at least partially at least at the extremely small thickness portion that has a thickness of 50 nm or less by the heat treatment at the partial melting temperature range in the heating and drying step after the screen printing (or at least partially aggregated by the heat treatment in the partial aggregating temperature range). In detail, the silver paste SP on the base paper 100 is processed by heating at a heating temperature in a given partial melting temperature range for a predetermined time. The heating temperature in the heating/drying step is preferably a temperature that is lower than a temperature (hereinafter may be referred to as "transformation starting temperature") at which the base material 10 starts being transformed by heating in the heating/drying step (that is, preferably a temperature less than the transformation starting temperature). For example, if the paper material is used as the base material 10, the temperature is a sufficiently lower temperature range than an ignition temperature or an ignition point of the paper material. For example, if the paper material is a common Western paper such as a large-sized paper, since the ignition point is 450° C. Thus, for example, the temperature may be a temperature less than 230° C., preferably a temperature less than 200° C., or a temperature less than 180° C. Alternatively, in this case, the heating temperature may be in a temperature range of 180 to 230° C., 180 to 220° C., 180 to 210° C., 180 to 200° C., or 180 to 190° C. Alternatively, in this case, the heating temperature may be in a temperature range of 150 to 180° C., 150 to 170° C., or 150 to 160° C., as a still lower temperature range. Further, when the base material 10 is the paper material, the temperature may be a temperature at which moisture in the paper stock is not scattered (i.e., in case of an environment of 1 atmosphere, a temperature less than 100° C., hereinafter may be referred to as "first low temperature range"). Alternatively, it may be a second low temperature range lower than the first temperature range by a predetermined temperature (e.g., approximately 10 to 15° C.). That is desirable in view of effectively preventing the base material 10 made of the paper stock from transformation in the heating/drying step, thereby keeping a good quality of the identifier providing device as a final product. For example, in this case, the heating temperature may be at a temperature range of 70 to 90° C. or 75 to 85° C., or a temperature range of 75 to 80° C. or 80 to 85° C.

More specifically, for example, a predetermined heating temperature in the heating/drying process is set at a predetermined temperature within the partial melting temperature range. Here, as shown in FIG. 12 (*c*), in the inside of the conductive layer 20A printed on the base paper 100, the selected silver flakes 50 are overlapped in a substantially parallel state to each other. At this time, as shown in FIG. 13 (*a*), if the adjacent selected silver flakes 50 (in the thickness direction) have their entirety almost completely overlapped in a state of being dispersed in the binder, the extremely small thickness portions or the ultra-small thickness portions of those selected silver flakes 50 are overlapped with each other typically at their respective peripheral portions (basically with the binder component interposed therebetween). Therefore, in this case, the present inventors have confirmed that the extremely small thickness portions or the ultra-small thickness portions of the selected silver flakes 50 become the extremely small thickness (thickness of 50 nm or less) such as the minimum thickness T3 or the ultra-small thickness (thickness of 25 to 35 nm or the like), respectively, and that the selected silver flakes 50 come into the partial melting state, as mentioned above, even at a predetermined temperature within the partial melting temperature range (hereinafter may be referred to as "relative low temperature range" to mean a heating temperature range of the silver paste that is relatively lower than the conventional one). Then, in this case, as shown in FIG. 13 (b), with the heating at the relative low temperature range, volatile components of the binder are evaporated. Consequently, the adjacent selected silver flakes 50 come into close contact with each other, and their facing extremely small thickness portions or ultra-small thickness portions are melted to be fused and bonded with each other so as to constitute a fused portion 52. It is thought that a portion other than the extremely small thickness portion or the ultra-small thickness portion of the selected silver flake 50 become a cohered portion 51 that has mutual faces brought in close contact (by the selected silver flakes 50 mutually getting closer by being softened and deformed by heat, though not melted). As a result, it is possible to obtain a high electrical conductivity between the adjacent selected silver flakes 50 particularly through the fused portion 52. Moreover, it is possible to obtain an excellent electrical conductivity even at the cohered portion 51. It is conceivable that a resin component (solid content) of the binder remains between the selected silver flakes 50 at a part of the cohered portion 51. Still, also in this case, it is thought that an interval between the selected silver flakes 50 is very minute (such as several nm or several tens of nm). Moreover, even in this case, it is thought that the resin component of the binder between the selected silver flakes 50 comes to dielectric breakdown thereby being able to ensure electrical conductivity after all.

Next, as shown in FIG. 13 (c), if the adjacent selected silver flakes 50 (in the thickness direction) have their portion (about one half in a radial direction) overlapped in the state of being dispersed in the binder, the extremely small thickness portions or the ultra-small thickness portions of those selected silver flakes 50 are overlapped with each other typically at their respective peripheral portions (basically with the binder component interposed therebetween). Therefore, also in this case, the present inventors have confirmed that the extremely small thickness portions or the ultra-small thickness portions of the selected silver flakes 50 become the extremely small thickness (thickness of 50 nm or less) such as the minimum thickness T3 or the ultra-small thickness (thickness of 25 to 35 nm or the like), respectively, and that they are melted by its size effect even at the relative low temperature range. Then, in this case, as shown in FIG. 13 (d), with the heating at the relative low temperature range, volatile components of the binder are evaporated. Consequently, the adjacent selected silver flakes 50 come into close contact with each other, and their facing extremely small thickness portions or ultra-small thickness portions are melted to be fused and bonded with each other so as to constitute the fused portion 52. It is thought that a portion other than the extremely small thickness portion or the ultra-small thickness portion of the selected silver flake 50 become the cohered portion 51 that has mutual faces brought in close contact, as mentioned above. As a result, it is possible to obtain a high electrical conductivity between the adjacent selected silver flakes 50 particularly through the fused portion 52. Moreover, it is possible to obtain an excellent electrical conductivity even at the cohered portion 51. Moreover, even if the resin component (solid content) of the binder remains at a part of the cohered portion 51, it is thought to be able to ensure the electrical conductivity by the dielectric breakdown thereof.

Next, as shown in FIG. 13 (e), if the adjacent selected silver flakes 50 (in the thickness direction) have only their peripheral portion overlapped in the state of being dispersed in the binder, the extremely small thickness portions or the ultra-small thickness portions of those selected silver flakes 50 are overlapped with each other at their respective peripheral portions (basically with the binder component interposed therebetween). Therefore, also in this case, the present inventors have confirmed that the extremely small thickness portions or the ultra-small thickness portions of the selected silver flakes 50 become the extremely small thickness (thickness of 50 nm or less) such as the minimum thickness T3 or the ultra-small thickness (thickness of 25 to 35 nm or the like), respectively, and that they are melted by its size effect even at the relative low temperature range. Then, in this case, as shown in FIG. 13 (f), with the heating at the relative low temperature range, volatile components of the binder are evaporated. Consequently, the adjacent selected silver flakes 50 come into close contact with each other, and their facing extremely small thickness portions or ultra-small thickness portions are melted to be fused and bonded with each other so as to constitute the fused portion 52. It is thought that a portion other than the extremely small thickness portion or the ultra-small thickness portion of the selected silver flake 50 become the cohered portion 51 that has mutual faces brought in close contact, as mentioned above. As a result, it is possible to obtain a high electrical conductivity between the adjacent selected silver flakes 50 particularly through the fused portion 52. Moreover, it is possible to obtain an excellent electrical conductivity even at the cohered portion 51. Moreover, even if the resin component (solid content) of the binder remains at a part of the cohered portion 51, it is thought to be able to ensure the electrical conductivity by the dielectric breakdown thereof.

As described above, in the present invention (including the present embodiment), the selected silver flake 50 as the silver particle component of the silver paste ink is substantially 100% silver (pure silver) (except impurities). Thus, the selected silver flake 50 maintains the fine average thickness due to the good malleability and ductility. At the same time, since the extremely small thickness and the ultra-small thickness are ensured, the selected silver flakes 50 is melted at least partially (by the so-called size effect) at a temperature within the predetermined relative low temperature range, particularly at the extremely small thickness portion and the ultra-small thickness portion. That is, if the average thickness of the selected silver flake 50 is set at 50 nm, the selected silver flake 50 starts melting entirely at a temperature not less than the lower limit value of the relatively low temperature range, for example, at about 200° C., too. Moreover, at a temperature not less than 230° C., the entire selected silver flake 50 is completely melted.

<Thickness of Conductive Layer>

In the identifier providing device of the present invention (including the present embodiment), a coating thickness of the silver paste ink is set in the screen printing process such that the conductive layer pattern 20 has a thickness in the range of 5 µm to 6 µm in a final state after the printing and the heating. Here, it is known that the conductive layer using the conventional silver paste does not work unless the thickness of the conductive layer is not less than a predetermined thickness. That is, it is regarded that, unless an aspect ratio (thickness/width) of the conductive layer is a large value such as about 1:1, it is impossible to obtain a sufficient conductivity. Moreover, it is conventionally known that, if there are irregularities on the conductive layer, a reactivity is lowered and a yield is decreased, too. Conventionally, in order to obtain a specific resistance of $10^{-5}$ Ωcm, the conductive layer needs to have a thickness of at least approximately 10 µm.

On the other hand, the identifier providing device of the present invention (including the present embodiment), the average thickness of the conductive layer pattern 20 is approximately 5 μm (or a range of 5 to 6 μm) that is about one half of 10 μm which has been the conventional minimum value. Alternatively, then identifier providing device of the present invention (including the present embodiment), the average thickness of the conductive layer pattern 20 may be a still smaller one such as in the range of 1 to 2 μm, or in the range of 1 to 3 μm. Here, if the average thickness of the conductive layer pattern 20 is 5 to 6 μm, at the inside thereof, the selected silver flakes 50 of typically several tens layers to less than one hundred layers (as calculated from the average thickness of the selected silver flakes 50) are in the stacked state with each other and in a partially fused state (and other portions being in substantially closely contacted state) in the thickness direction. Further, even if the average thickness of the conductive layer pattern 20 is 1 μm, in its interior, the selected silver flakes 50 of approximately ten and several layers (or about 10 to 20 layers) are in the stacked state and in the partially fused state (and the other portions being in substantially closely contacted state) in its thickness direction. The present inventors have confirmed that it is possible to obtain a sufficient conductivity even with the conductive layer pattern 20 having such a very small average thickness. It is considered that, as described above, this largely depends on the selected silver flakes 50 having at least a portion thereof fused (forming the fused portion 52).

<Effect of Shielding Layer Due to Thickness of Conductive Layer>

In the identifier providing device of the present invention (including the present embodiment), as described above, the average thickness of the conductive layer pattern 20 is a very small thickness (for example, 5 μm to 6 μm). Thus, in case the shielding layers (the primary coat and the secondary coat) are coated over the conductive layer pattern 20 of the base material 10 so as to shield the conductive layer pattern 20 from the outside, the contour of the conductive layer pattern 20 does not stand out and is not conspicuous. Consequently, it is possible to greatly improve a shielding property against visibility from the outside.

Here, in the case of two-layer printing of the shielding layer and the primary coat and the secondary coat, particularly if the shielding layer is formed by printing using the blue ink, as described above, a first layer is constituted by the primary coat 31 by the mesh-like blue ink, while a second layer being constituted by the secondary coat made of the solid blue ink. Thus, it is possible to improve the shielding effect.

Meanwhile, in case the shielding layer is formed by printing with the white ink to shield the conductive layer patterns 20 on the base material 10 from the outside, it is also possible to provide only one layer of shield layer. Still, in order to surely shield the visibility from the outside, it is preferable that the shielding layer has the two-layer structure. In this case, as in the case of blue ink, it is unnecessary to make the first layer into the mesh shape.

Here, if the average thickness of the conductive layer pattern 20 is 10 μm, it becomes about twice (of the average thickness of 5 to 6 μm of the present invention). Consequently, even if the conductive layer pattern 20 on the base material 10 is intended to be shielded by the shielding layer, the contour stands out in a convex form by the thickness of the conductive layer pattern 20. Thus, shielding by the printing ink is impossible for practical purposes. Therefore, in this case, it is necessary to conceal the conductive layer pattern 20 from the outside by sticking a shielding film or a shielding sheet having more thickness over the conductive layer pattern 20. Thus, work efficiency is greatly reduced and production costs are greatly increased.

As described above, in case the conductive layer pattern 20 (exhibiting a silver color) of the base material 10 is shielded by the printing of white ink, a gray ink having a same type of color (as the silver color) is coated on the conductive layer pattern 20 exhibiting the silver color so as to form a first shielding layer. A white ink may be printed further thereon to form a second shielding layer. Still, in this case, the gray color of the first shielding layer is possibly transmitted through the white ink layer of the second shielding layer, so that an entire rear surface (surface forming the conductive layer pattern 20) of the base material 10 may appear as a gray tone. In this case, another one layer of a white layer may be coated from a top of the second shielding layer as a third shielding layer, so as to make the entire rear surface (surface forming the conductive layer pattern 20) of the base material 10 into a white tone, thereby improving a design. Furthermore, if a transparent protective film is coated and formed by a varnish or the like on the second shielding layer or the third shielding layer, the shielding layer can be effectively prevented from delamination. In this case, it has four layers in total, thereby increasing costs. Therefore, such a transparent protective film is formed depending on an application of the identifier providing device (if it is worth the cost).

As described above, the identifier providing device of the present invention (including the present embodiment) is able to achieve a complete shielding (blindfolding) by the printing ink if it is necessary to shield (blindfold) the conductive layer pattern 20 of the base material 10 from the outside. Consequently, it is possible to greatly reduce the manufacturing cost as compared with the case of shielding by sticking the shielding film or the shielding paper or the like.

Moreover, even in the case of shielding (blindfolding) the conductive layer pattern 20 of the base material 10, if the number of shielding layers by printing is too many, the production cost also increases correspondingly. Furthermore, an influence on an appearance of the entire identifier providing device is not negligible. Accordingly, it is preferable to blindfold it in several times (shielding by 2 to 3 layers). In the case of the present invention, since the average thickness of the conductive layer pattern 20 is very small. Thus, the conductive layer pattern 20 of the base material 10 can be blindfolded completely in one or two times of stacked formations by printing with the printing inks. It is thought that, even in the printing ink layer (a first coat 31, a second coat or the like) as the shielding layer, the printing ink is coated and formed by several tens to several hundreds nano-level or a few micron level on the conductive layer pattern 20 of the base material 10. That is, as in the prior art, if the thickness of the conductive layer is large, the outline of the conductive layer inevitably appears to the outside. Thus, as the thickness of the conductive layer is smaller, it is advantageous in case of performing the shielding from the outside. For example, in the case of the conductive layer made of the conventional spherical silver particles, the average thickness is approximately 30 μm. Accordingly, even if the conductive layer having such a large thickness is intended to be shielded and blindfolded by the printing ink, it cannot be completely blindfolded.

<Silicon as Additive of Silver Paste Ink (Light Diffusion Material)>

In the present invention (including the present embodiment), as described above, a predetermined small amount (e.g., about 2%) of silicone particles may be further added to the printing ink as the shielding layer of the conductive layer pattern 20 of the base material 10, further. In this way, in the case of forming the shielding layer by the printing ink, the light passing through the shielding layer is irregularly reflected by the silicon particles dispersed in the interior of the shielding layer. Thus, light, it is possible to further improve the shielding effect. That is, as described above, in order to shield the conductive layer pattern 20 of the base material 10 to make it hard to be seen from the outside, it is better to increase the number of the shielding layers of the printing ink (for example, it is preferable to provide 5 to 6 layers). Still, in this case, the cost becomes high. Therefore, instead of increasing the number of the shielding layers, the silicon particles are added by only a small amount to the printing inks for the shielding layer, thereby utilizing the light diffused reflection effect. The present inventors have confirmed that, by addition of 2% of the silicon particles into the blue ink for the aforementioned first coat 31, it is possible to completely curb visibility from the outside of the conductive layer pattern 20. Incidentally, the amount of the silicon particles added to the printing ink for shielding is too high, there is an increasing possibility that the silicon particles inhibit the electrical conduction effect (by the selected silver flakes 50) of the conductive layer pattern 20. Consequently, there is an increasing possibility that an electrical response is deteriorated. Accordingly, a proportion of the silicon particles to be added to the printing ink for the shielding is preferably in a minor amount in a range of 1 to 3 wt %, and more preferably at 2 wt %. The ratio of the silicon particles to be added to the printing ink for the shielding may be 1 to 2 wt %. Still, as the ratio approaches 1%, the light diffused reflection effect is reduced. Thus, it is preferable to use a value close to 2% after all.

<Aspect Ratio of Conductive Layer (Conductive Portion)>

In the identifier providing device of the present invention (including the present embodiment), as the size of a planar direction of the conductive layer pattern 20, for example, the conductive portion 23 may be set at a width of 1 mm, and the PC-side contact portion 24 may be set at a diameter of 7 mm. In this case, the aspect ratio (ratio of the width to the thickness) is 200 at the portion of the conductive portion 23, in which Thickness:Width=5 µm:1 mm (1000 µm)=1:200. Here, in case of forming a circuit pattern by a conductive layer using the conventional conductive paste, unless the thickness to the width of the conductive layer is not less than a predetermined thickness, i.e., unless the aspect ratio is considerably small value, a predetermined conductivity operation cannot be done (typically aspect ratio of about 1 is sometimes desirable in which thickness:width=1:1).

On the other hand, in the present invention (including the present embodiment), as described above, the present inventors have found that, though the aspect ratio becomes 200 and very large at the conductive portion 23 of the conductive layer pattern 20, for example, in which Thickness:Width=5 µm:1 mm (1000 µm)=1:200, the necessary electrical conductivity is ensured between the PC-side contact portion 24 and the extended portion 22. That is, the present invention is thought to be a technique that is able to ensure the good electrical conductivity even if the aspect ratio of the conductive layer is about 200 (or, in a range of about 100 to 200).

<Formation of Conductive Layer by Printing>

The present invention (including the present embodiment) is able to mass-produce the required conductive layer (i.e., conductive layer pattern 20) all by the printing technique (such as the screen printing). In a technique for forming a conductive layer by printing the conductive paste containing the conventional silver paste on the base material (such as the paper) (hereinafter may be referred to as "conventional conductive layer forming technique on base material"), it has been very difficult to mass-produce the aforementioned conductive layer of the very small average thickness as in the present invention (including the present embodiment), including a small lot and a large lot (even though a prototype may be possible). That is, the present inventors have confirmed that, with the conventional conductive layer forming technique on base material, even if the conductive layer is formed by printing on the base material, the conductive layer does not always sufficiently react (i.e., the conductive layer is not energized). It is thought that it is because there have been problems to be solved in terms of the printing technique, in case of printing the conductive layer on a base material by the silver paste or the like, such as the conductive layer on the base material becomes uneven or it is difficult to put the ink on the screen, etc. For example, if there are irregularities on the conductive layer, the reactivity of the conductive layer decreases and the yield is lowered. Furthermore, if the conductive layer is formed on the base material by printing, a kneading method is required in accordance with the characteristics of the printing ink (i.e., silver paste ink). As described above, the present invention (including the present embodiment) solves these problems in terms of the printing techniques, thereby enabling mass production. Then, the present invention drastically improves the conductivity of the conductive layer pattern 20, for example. Consequently, even if the PC-side contact portion 24 is made into a very small diameter of 7 mm, it can obtain a sufficient capacitance change for the capacitive touch device of the touch-type computer device.

<Other Printing Methods>

In the production of the identifier providing device of the present invention (including the present embodiment), in addition to using the aforementioned screen printing technique, the other printing techniques may also be used. A gravure printing techniques may be used, for example. In the case of the gravure printing, the average thickness of the conductive layer pattern 20 formed on the base material 10 can be made smaller than the case of the screen printing (the aforementioned average thickness of 5 to 6 µm) (e.g., it can be an average thickness of 1 µm). However, in the case of the gravure printing, it is necessary to fill 10 to 20 pieces of the selected silver flake 50 at an inside of a cell cylinder for the gravure printing (recess of concave type). Thus, if a filling rate of the selected silver flakes 50 in the interior of each cell is not more than this, it is possible that the formed conductive layer is broken. Therefore, the particle size of the selected silver flakes 50 is preferably set in a range of 3.5 to 4.5 µm, as in the case of the screen printing, such that the filling ratio of the selected silver flakes 50 in the interior of each cell becomes in the range of 10-20.

[Operation and Effect]

With the identifier providing device of the present embodiment, a user grips the tab 12 as the grip portion of the base material 10 by hand and makes the rear surface of the base portion 11 (surface facing the touch screen of the touch-type computer device) approach and contact with the touch screen. Then, the PC-side contact portions 24 are planarly contacted with contact areas of the touch screen, respectively. Thereby, the plurality of the PC-side contact portions 24 touch buttons (as pre-selected plural contact areas) (at the same time or at a slight time lag). At this time, since the user grips the tab 12 of the identifier providing device (at least when pressing the identifier providing device against the touch screen), the finger of the user and the selected plural buttons are electrically connected (electrically conducted) via the conductive portion 23. Thereby, electric charges move between the finger of the user and the buttons with which the PC-side contact portion 24 is contacted. Thereby, the capacitances of the buttons change. Consequently, the touch-type computer device executes a specific processing set in advance corresponding to the combination of the buttons.

Second Embodiment

Figure 19:
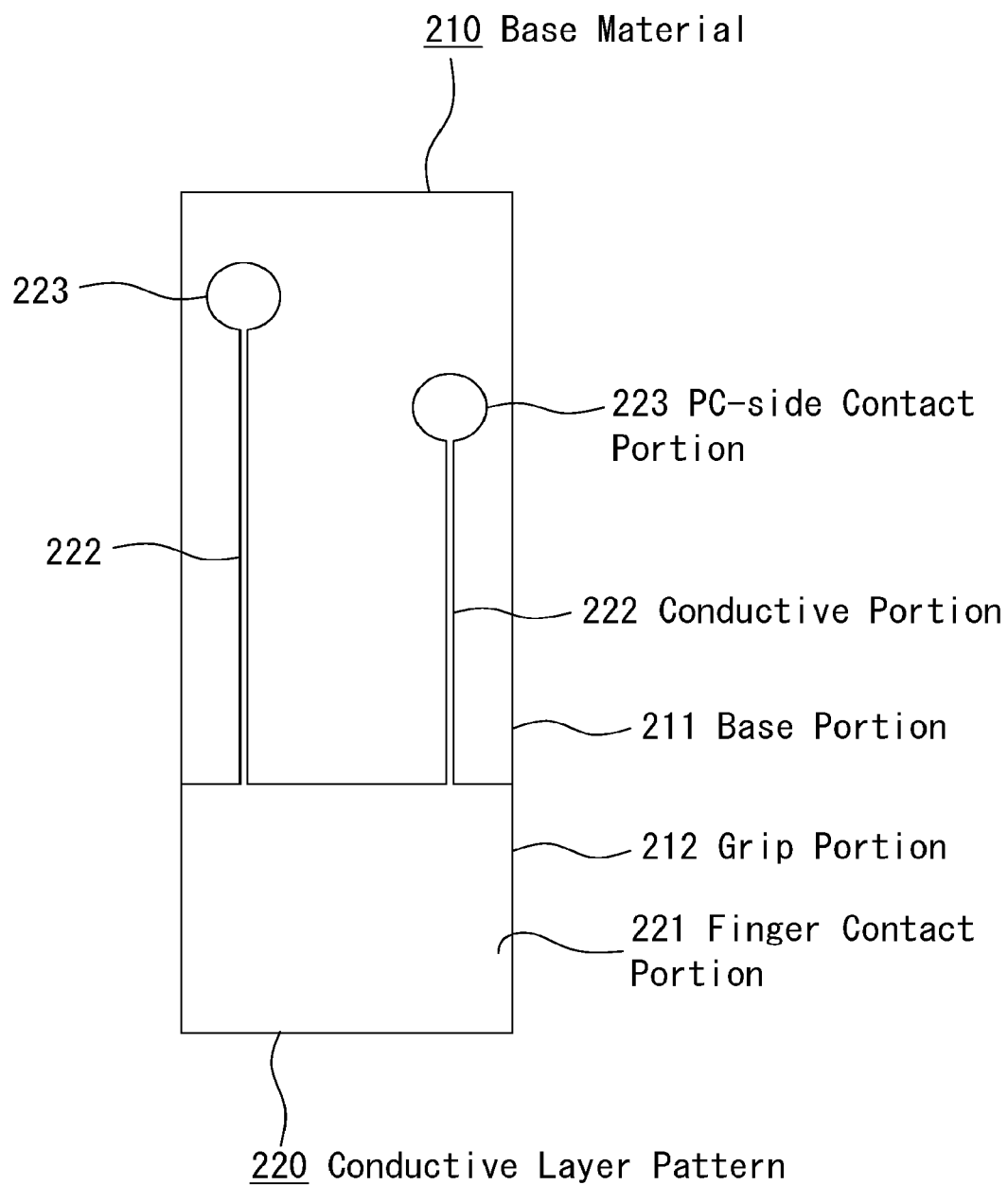
FIG. 19 is a plan view showing an identifier providing device for a computer device according to a second embodiment of the present invention.

The present invention may be embodied as an identifier providing device of the embodiment shown in FIG. 19 (Second Embodiment). As shown in FIG. 19, this identifier providing device includes a base material 210 that is integrally formed so as to be a predetermined shape, and a conductive layer pattern 220 that is integrally formed at a predetermined area of a surface of the base material 210. The base material 210 is formed into an integral sheet shape as a whole and has a vertically long rectangular outline. A rectangular portion as a major portion at one end side in a length direction thereof is made into a base portion 211. A rectangular portion as a remaining portion at the other end side in the longitudinal direction thereof is made into a grip portion 212. The base material 210 is formed integrally so as to have a sheet shape made of the base portion 211 and grip portion 212 (shown in FIG. 19) by a sheet of paper material having a predetermined paper quality.

On the other hand, the conductive layer pattern 220 is a conductive layer having a predetermined pattern shape that includes a finger contact portion 221 as a human body side grounding portion, an extended portion 222 as a general-purpose conductor portion, a conductive portion 223 as a separate conductor portion, and a PC-side contact portion 224 as a PC drive portion. The conductive layer pattern 220 is formed by coating a silver paste ink in a slurry state containing predetermined selected silver flakes on a rear surface of the base portion 211 of the base material 210, as in the conductive layer patterns 20 of the first embodiment, so as to form a predetermined pattern. In detail, the finger contact portion 221 is a conductive layer having a predetermined film thickness which is coated and formed on the entire rear surface of the grip portion 212, as in the rear surface of the finger contact portion 21 of the tab 12 in the first embodiment. The finger contact portion 221 is a portion that operates in the same manner as the finger contact portion 21 so as to be conducted with the user's fingers when the user grips the grip portion 221 with the fingers. Further, the conduction portion 222 has the same configuration as the conductive portion 23 of the first embodiment and operates in the same manner as the conductive portion 23. Furthermore, the PC-side contact portion 223 has the same configuration as the PC side contact portion 24 of the first embodiment and operates similarly to the PC-side contact portion 24. That is, the conductive portion 222 and the PC-side contact portion 223 are a conductive layer having a predetermined thickness (the same thickness as the finger contact portion 212) coated and formed in a predetermined arranging manner at predetermined positions and at a predetermined portion of the rear surface of the base portion 211, respectively. The length of the base portion 211 of the base material 210 may be set at, for example, a length of about 60 to 90% of a total length of the base material 210, preferably, a length of about 60 to 80%, more preferably, a length of about 70%. On the other hand, the length of the grip portion 212 may be set at, for example, a length of about 10 to 40% of the total length of the base material 210, preferably, a length of about 20 to 40%, more preferably, a length of approximately 30%. Still, in order to reduce the amount of the silver paste, it is preferable to reduce the area by shortening the length of the grip portion 211. The conductive layer pattern 220 is formed in the same manner as in the first embodiment by the same material ink for the conductive layer pattern 20 in the first embodiment.

Identifier providing device of the second embodiment may be produced in the same manner as the identifier providing device according to the first embodiment. It exhibits the same function and effects as the identifier providing device according to the first embodiment.

Third Embodiment

Figure 20:
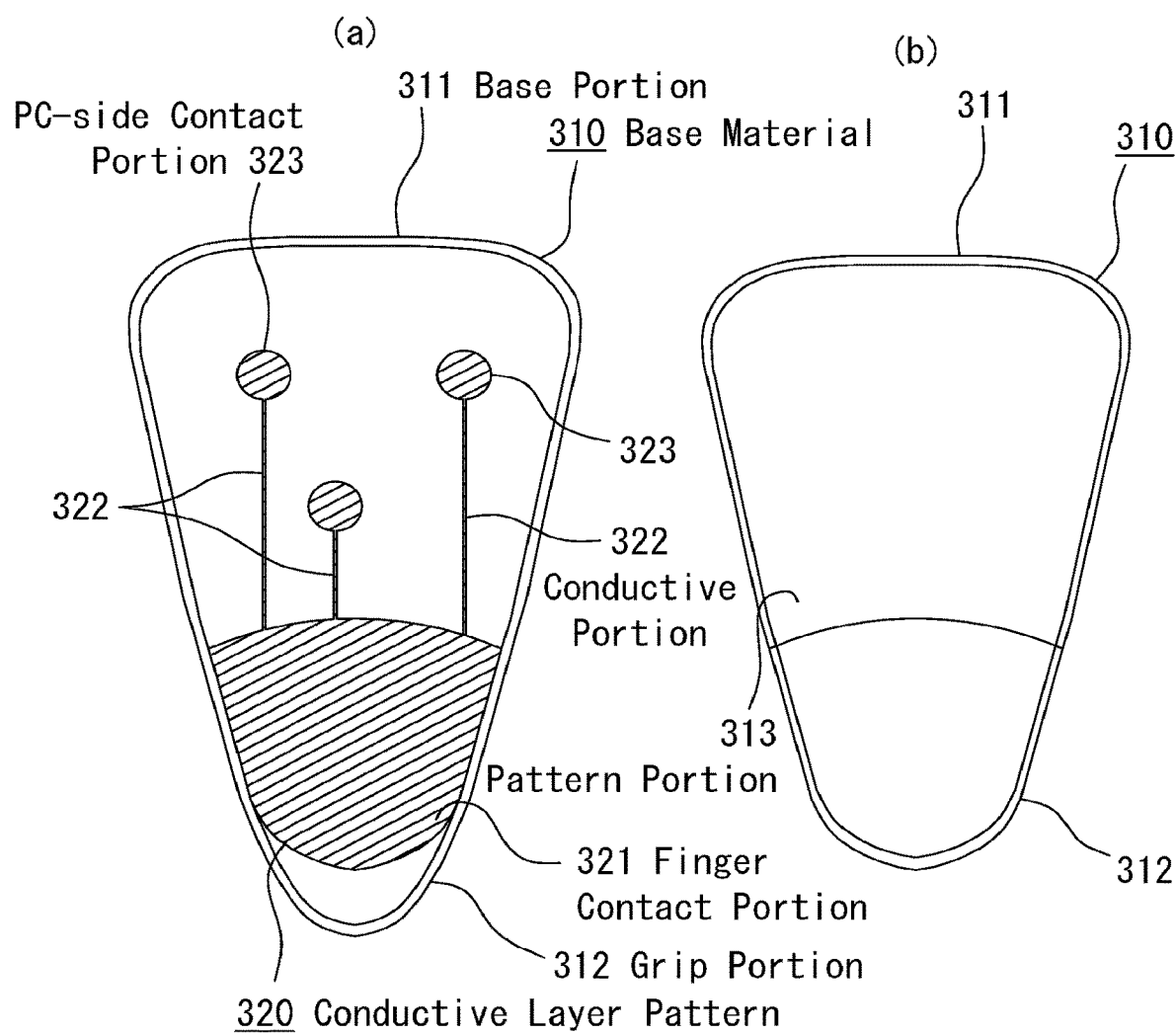
FIG. 20 is a plan view showing an identifier providing device for a computer device according to a third embodiment of the present invention.

The present invention may be embodied as an identifier providing device of the embodiment shown in FIG. 20 (Third Embodiment). As shown in FIG. 20, this identifier providing device includes a base material 310 that is integrally formed so as to be a predetermined shape, and a conductive layer pattern 320 that is integrally formed at a predetermined area of a surface of the base material 310. The base material 310 is formed into an integral sheet shape as a whole and has an outline of a vertically elongated fan shape or a rounded isosceles triangular shape. A substantially trapezoidal portion as a major portion at one end side in a longitudinal direction thereof is made into a base portion 311. A short fan-shaped or small isosceles-triangular-shaped portion as the remaining portion at the other end side in the longitudinal direction is made into a grip portion 312. The base material 310 is formed integrally so as to have a sheet shape made of the base portion 311 and grip portion 312 (shown in FIG. 20) by a sheet of paper material having a predetermined paper quality. A front surface of the grip portion 312 is provided with a pattern portion 313 that is similar to the pattern portion 13 of the first embodiment. Here, FIG. 20 (a) depicts a state where a rear surface of the base material 310 is not provided with a shielding layer (i.e., a state in which the conductive layer pattern 320 is exposed), for convenience sake of explanation, while illustrating a structure at rear surface side of the identifier providing device. That is, the rear surface of the base material 310 is covered with the shielding layer similar to the first embodiment, after forming the conductive layer pattern 320.

On the other hand, the conductive layer pattern 320 is a conductive layer having a predetermined pattern shape that includes a finger contact portion 321 as a human body side grounding portion, an extended portion 322 as a general-purpose conductor portion, a conductive portion 323 as a separate conductor portion, and a PC-side contact portion 324 as a PC drive portion. The conductive layer pattern 320 is formed by coating a silver paste ink in a slurry state containing predetermined selected silver flakes on a rear surface of the base portion 311 of the base material 310, as in the conductive layer patterns 20 of the first embodiment, so as to form a predetermined pattern. In detail, the finger contact portion 321 is a conductive layer having a predetermined film thickness which is coated and formed on nearly the entire rear surface (all the part except a lower end part in the example of FIG. 20) of the grip portion 312, as in the rear surface of the finger contact portion 21 of the tab 12 in the first embodiment. The finger contact portion 321 is a portion that operates in the same manner as the finger contact portion 21 so as to be conducted with the user's fingers when the user grips the grip portion 312 with the fingers. Further, the conduction portion 322 has the same configuration as the conductive portion 23 of the first embodiment and operates in the same manner as the conductive portion 23. Furthermore, PC-side contact unit 323 has the same configuration as the PC-side contact portion 24 of the first embodiment and operates similarly to the PC-side contact portion 24. That is, the conductive portion 322 and the PC-side contact portion 323 are a conductive layer having a predetermined thickness (the same thickness as the finger contact portion 312) coated and formed in a predetermined arranging manner at predetermined positions and at a predetermined portion of the rear surface of the base portion 311, respectively. The length of the base portion 311 of the base material 310 may be set at, for example, a length of about 50 to 80% of a total length of the base material 310, preferably, a length of about 60 to 70%, more preferably, a length of about 60%. On the other hand, the length of the grip portion 312 may be set at, for example, a length of about 20 to 50% of the total length of the base material 210, preferably, a length of about 30 to 40%, more preferably, a length of approximately 40%. Still, in order to reduce the amount of the silver paste, it is preferable to reduce the area by shortening the length of the grip portion 311. The conductive layer pattern 320 is formed in the same manner as in the first embodiment by the same material ink for the conductive layer pattern 20 in the first embodiment.

Identifier providing device of the third embodiment may be produced in the same manner as the identifier providing device according to the first embodiment. It exhibits the same function and effects as the identifier providing device according to the first embodiment.

Application of the Present Invention

The present invention, is structured as described above, so that it is possible to cope with the paper stock as the base material 10, 210, 310. That is, the present invention is able to convert the conventional conductive ink for use to the paper stock (to change the material) so as to make a device. Further, the present invention can make easily and reliably a desired identifier (ID) on the base material by printing. Furthermore, since the present invention can form a predetermined pattern the conductive layer by printing the silver paste on the base material, it can easily form the identification information (ID) used in the software processing of the computer device, while patterning it individually as required (so as to be unique). Incidentally, in the identifier providing device of the present invention, the pattern of the conductive layer pattern 20, 220, 320 does not have a specific meaning by itself (as in a conventional electronic circuitry). The pattern is read into the computer device to provide a unique identifier to the computer device, as with bar codes, so as to make the computer device execute a processing or an operation corresponding to the unique identifier. The present invention manufactures a device to provide such an identifier by a printing technique. Therefore, basically, the conductive layer pattern 20, 220, 320 of the identifier providing device does not constitute a specific content by itself (although it is possible to configure it in such a way). The conductive layer pattern 20, 220, 320 functions only as a unique identifier. The processing by the computer device is executed as a separate processing based on the unique identifier.

Moreover, the present invention may use any material as a material for the base material, in addition to the paper, as long as it is a versatile high electrical insulating material. For example, a material such as an acrylic resin, a wood, a plastic, or a PET may also be used. Furthermore, a ceramic or a stone can be used (though its versatility is low).

Furthermore, in the identifier providing device of the present invention, although it is fundamental to blindfold the conductive layer pattern 20, 220, 320 on the base material 10, 210, 310 from the outside by the shield layer, as described above, it is possible no to provide a shielding layer. Further, the identifier providing device of the present invention is applicable to an electronic device or a computer device configured to be driven using a specific pattern of the conductive layer, in addition to the capacitive touch device. For example, it may be applied to NFC (Near Field Communication).

INDUSTRIAL APPLICABILITY

The present invention is applicable to various identifier providing devices that form a desired identifier (ID) in a variety of patterns on various base materials made of an insulating material by printing.

10: base material, 11: base portion, 12: tab (grip portion), 13: pattern portion
20: conductive layer pattern, 21: finger contact portion, 22: extended portion, 23: conductive portion
24: PC-side contact portion, 31: shielding layer, 32: shielding layer, 50: selected silver flake
210: base material, 211: base portion, 212: grip portion
220: conductive layer pattern, 221: finger contact portion, 222: conductive portion, 223: PC-side contact portion
310: base material, 311: base portion, 312: grip portion, 313: pattern portion
320: conductive layer pattern, 321: finger contact portion, 322: conductive portion, 323: PC-side contact portion.

The invention claimed is:

1. An electrically conductive device, comprising:
a base material as an insulator, and
a conductive layer pattern formed by coating a silver paste on a predetermined surface of the base material so as to be a predetermined pattern by printing,
wherein the silver paste for forming the conductive layer pattern contains, as silver particles, only silver flake having a particle size in a range of 3.0 to 5.0 μm and a thickness at a maximum thickness portion which is a positive number in a range of 100 nm or less and a thickness at an extremely small thickness portion which is a positive number in a range of 50 nm or less,
wherein the thickness at the maximum thickness portion of the silver flake is larger than an average thickness of the silver flake, while the thickness at the extremely small thickness portion of the silver flake is smaller than the average thickness of the silver flake,
wherein the conductive layer pattern is formed by laminating the silver flakes in a thickness direction such that a film thickness which is a positive number in a range of 10 μm or less, and
wherein the silver flakes forming the conductive layer is in a fused state or in an aggregated/cohering state with each other at the extremely small thickness portion.

2. An electrically conductive device as recited in claim 1, wherein:
the base material has a base portion as a main portion having a first dimension in a first direction and a second dimension in a second direction perpendicular to the first direction, and a grip portion as an appendage portion formed continuously to one end in the first direction of the base portion,
the conductive layer pattern includes a finger contact portion of a planar shape having a predetermined area as a first conductive layer portion, an extended portion of a planar shape having a predetermined area as a second conductive layer portion that is formed on the rear surface of the base portion to extend in a crossing manner to the first direction and to be electrically connected with the finger contact portion, a plurality of conductive portions having a conductor shape as third conductive layer portions that are formed on the rear surface of the base portion to extend from the extended portion linearly in the first direction of the base portion and to be electrically connected with the extended portion, and a plurality of PC-side contact portions of a planar shape having a predetermined area as fourth conductive layer portions that are formed on the rear surface of the base portion to be electrically connected with leading ends of the conductive portions, respectively, and the extended portion of the conductive layer pattern is extended at a predetermined extended angle so as to be extended to a base end position of two of the conductive portions that have two of the PC-side contact portions formed at leading ends thereof, when the two of the PC-side contact portions among the plurality of the PC-side contact portions are disposed at opposite end portions in the second direction of the base portion.

3. An electrically conductive device as recited in claim 1, further comprising a first coat and a second coat as shielding layers to completely shield an entirety of the conductive layer patter formed on the rear surface of the base material, wherein the first coat is made of a coating film of lattice-like shape as a primer layer that is formed on the conductive layer pattern formed on the rear surface of the base portion, and wherein the second coat is made of a coating film of completely sealing shape as a top coating layer that is formed on the first coat.

4. An electrically conductive device as recited in claim 1, wherein the conductive layer pattern is formed by a silver paste ink with the silver flakes dispersed in a predetermined binder, while containing a mixture of a polyurethane resin and a heat resistant resin as the binder to disperse the silver flakes.

5. An electrically conductive device as recited in claim 4, wherein the conductive layer pattern has a content rate of the silver flakes in the silver paste ink in a range of 30 to 45 wt %.

6. An electrically conductive device as recited in claim 5, wherein the conductive layer pattern has a thickness in a range of 5 μm to 6 μm.

7. An electrically conductive as recited in claim 1, wherein:

the silver paste ink has the silver flake added with a diluent and dispersed in a binder, a mixture of a polyurethane resin and a heat resistant resin is used as the binder for dispersing the silver flake, and a blending ratio of the silver flake is within a range of 30 to 45 wt %, while a blending ratio of the diluent is within the range of 3 to 5 wt % and the blending ratio of the binder is within the range of 50 to 67 wt %.

8. An electrically conductive as recited in claim 1, wherein a content rate of the silver flake is set in a range of 40 to 45% to obtain a×$10^{-5}$ Ωcm (where "a" is any real number in a range of not less than 1 and less than 10) as a specific resistance.

* * * * *